US008547773B2

(12) United States Patent
Saiki et al.

(10) Patent No.: US 8,547,773 B2
(45) Date of Patent: Oct. 1, 2013

(54) INTEGRATED CIRCUIT DEVICE AND ELECTRONIC INSTRUMENT

(75) Inventors: Takayuki Saiki, Suwa (JP); Satoru Ito, Suwa (JP); Masahiko Moriguchi, Suwa (JP); Takashi Kumagai, Chino (JP); Hisanobu Ishiyama, Chino (JP); Takashi Fujise, Shiojiri (JP); Junichi Karasawa, Tatsuno-machi (JP); Satoru Kodaira, Chino (JP); Kazuhiro Maekawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1289 days.

(21) Appl. No.: 11/477,714

(22) Filed: Jun. 30, 2006

(65) Prior Publication Data

US 2007/0013634 A1 Jan. 18, 2007

(30) Foreign Application Priority Data

Jun. 30, 2005 (JP) ................................ 2005-192479
Sep. 1, 2005 (JP) ................................ 2005-253389
Feb. 10, 2006 (JP) ................................ 2006-034499

(51) Int. Cl.
*G11C 8/00* (2006.01)

(52) U.S. Cl.
USPC .................................................... 365/230.03

(58) Field of Classification Search
USPC ............................................. 365/63, 230.03
See application file for complete search history.

(56) References Cited

U.S. PATENT DOCUMENTS

| | | | |
|---|---|---|---|
| 4,456,977 | A | 6/1984 | Hayashi |
| 4,472,638 | A | 9/1984 | Nishizawa et al. |
| 4,549,174 | A | 10/1985 | Funada et al. |
| 4,566,038 | A | 1/1986 | Dimick |
| 4,587,629 | A | 5/1986 | Dill et al. |
| 4,648,077 | A | 3/1987 | Pinkham et al. |
| 4,975,753 | A | 12/1990 | Ema |
| 4,990,996 | A | 2/1991 | Kumar et al. |
| 5,001,108 | A | 3/1991 | Taguchi |
| 5,040,152 | A | 8/1991 | Voss et al. |
| 5,058,058 | A | 10/1991 | Yasuda et al. |
| 5,233,420 | A | 8/1993 | Piri et al. |
| 5,267,211 | A | 11/1993 | Kobayashi et al. |

(Continued)

FOREIGN PATENT DOCUMENTS

| | | |
|---|---|---|
| CN | 1534560 | 10/2004 |
| CN | 1542964 | 11/2004 |

(Continued)

OTHER PUBLICATIONS

U.S. Appl. No. 11/270,569, filed Nov. 10, 2005 in the name of Satoru Kodaira et al.

(Continued)

*Primary Examiner* — Anthan Tran
(74) *Attorney, Agent, or Firm* — Oliff & Berridge, PLC

(57) ABSTRACT

An integrated circuit device includes at least one data driver block for driving data lines, a plurality of control transistors TC1 and TC2, each of the control transistors being provided corresponding to each output line of the data driver block and controlled by using a common control signal, and a pad arrangement region in which data driver pads P1 and P2 for electrically connecting the data lines and the output lines QL1 and QL2 of the data driver block are disposed. The control transistors TC1 and TC2 are disposed in the pad arrangement region.

25 Claims, 26 Drawing Sheets

(56) References Cited

U.S. PATENT DOCUMENTS 5,272,665 A 12/1993 Uesugi
5,325,338 A 6/1994 Runaldue et al.
5,414,443 A 5/1995 Kanatani et al.
5,426,603 A 6/1995 Nakamura et al.
5,490,114 A 2/1996 Butler et al.
5,517,051 A 5/1996 Chatterjee
5,544,306 A 8/1996 Deering et al.
5,555,209 A 9/1996 Smith et al.
5,598,346 A 1/1997 Agrawal et al.
5,652,689 A 7/1997 Yuan
5,659,514 A 8/1997 Hazani
5,701,269 A 12/1997 Fujii
5,739,803 A 4/1998 Neugebauer
5,744,837 A 4/1998 Kamiura et al.
5,751,065 A 5/1998 Chittipeddi et al.
5,767,865 A 6/1998 Inoue et al.
5,815,136 A 9/1998 Ikeda et al.
5,850,195 A 12/1998 Berlien, Jr. et al.
5,860,084 A 1/1999 Yaguchi
RE36,089 E 2/1999 Ooishi et al.
5,903,420 A 5/1999 Ham
5,909,125 A 6/1999 Kean
5,917,770 A 6/1999 Tanaka
5,920,885 A 7/1999 Rao
5,933,364 A 8/1999 Aoyama et al.
5,962,899 A 10/1999 Yang et al.
6,005,296 A 12/1999 Chan
6,025,822 A 2/2000 Motegi et al.
6,034,541 A 3/2000 Kopec, Jr. et al.
6,111,786 A 8/2000 Nakamura
6,118,425 A 9/2000 Kudo et al.
6,125,021 A 9/2000 Duvvury et al.
6,140,983 A 10/2000 Quanrud
6,225,990 B1 5/2001 Aoki et al.
6,229,336 B1 5/2001 Felton et al.
6,229,753 B1 5/2001 Kono et al.
6,246,386 B1 6/2001 Perner
6,259,459 B1 7/2001 Middleton
6,262,541 B1 7/2001 Asai
6,278,148 B1 8/2001 Watanabe et al.
6,324,088 B1 11/2001 Keeth et al.
6,339,417 B1 1/2002 Quanrud
6,340,963 B1 1/2002 Anno et al.
6,421,286 B1 7/2002 Ohtani et al.
6,489,689 B2 12/2002 Nojiri
6,552,705 B1 4/2003 Hirota
6,559,508 B1 5/2003 Lin et al.
6,580,631 B1 6/2003 Keeth et al.
6,611,407 B1 8/2003 Chang
6,646,283 B1 11/2003 Akimoto et al.
6,697,037 B1 2/2004 Alt et al.
6,724,378 B2 4/2004 Tamura et al.
6,731,538 B2 5/2004 Noda et al.
6,791,632 B2 9/2004 Lee et al.
6,822,631 B1 11/2004 Yatabe
6,826,116 B2 11/2004 Noda et al.
6,839,097 B2 1/2005 Park et al.
6,858,901 B2 2/2005 Ker et al.
6,862,247 B2 3/2005 Yamazaki
6,873,310 B2 3/2005 Matsueda
6,873,566 B2 3/2005 Choi
6,898,096 B2 5/2005 Endo et al.
6,999,353 B2 2/2006 Noda et al.
7,034,792 B2 4/2006 Tamura
7,078,948 B2 7/2006 Dosho
7,081,879 B2 7/2006 Sun et al.
7,102,223 B1 9/2006 Kanaoka et al.
7,110,274 B1 9/2006 Endo et al.
7,142,221 B2 11/2006 Sakamaki et al.
7,158,439 B2 1/2007 Shionori et al.
7,164,415 B2 1/2007 Ooishi et al.
7,176,864 B2 2/2007 Moriyama et al.
7,180,495 B1 2/2007 Matsueda
7,193,623 B2 3/2007 Moon
7,233,511 B2 6/2007 Endo et al.
7,256,976 B2 8/2007 Sato
7,280,329 B2 10/2007 Kim et al.
7,317,627 B2 1/2008 Endo et al.
7,330,163 B2 2/2008 Nakai et al.
7,342,302 B2 3/2008 Kanaoka et al.
7,369,195 B2 5/2008 Wu et al.
7,391,668 B2 6/2008 Natori et al.
7,411,804 B2 8/2008 Kumagai et al.
7,411,861 B2 8/2008 Kodaira et al.
7,466,603 B2 12/2008 Ong
7,471,573 B2 12/2008 Kodaira et al.
7,480,164 B2 1/2009 Endo et al.
7,508,370 B2 3/2009 Sekiguchi et al.
7,522,441 B2 4/2009 Kumagai et al.
7,629,652 B2 12/2009 Suzuki et al.
7,759,804 B2 7/2010 Kanaoka et al.
7,940,500 B2 5/2011 Yang et al.
8,054,710 B2 11/2011 Ito et al.
2001/0008498 A1 7/2001 Ooishi
2001/0014051 A1 8/2001 Watanabe et al.
2001/0022744 A1 9/2001 Noda et al.
2002/0011998 A1 1/2002 Tamura
2002/0015128 A1 2/2002 Sakaguchi
2002/0036625 A1 3/2002 Nakamura
2002/0067328 A1 6/2002 Yumoto et al.
2002/0080104 A1* 6/2002 Aoki ............................... 345/87
2002/0105510 A1 8/2002 Tsuchiya
2002/0113783 A1 8/2002 Tamura et al.
2002/0126108 A1 9/2002 Koyama et al.
2002/0154557 A1 10/2002 Mizugaki et al.
2003/0020845 A1 1/2003 Lee et al.
2003/0034948 A1 2/2003 Imamura
2003/0053022 A1 3/2003 Kaneko et al.
2003/0053321 A1 3/2003 Ishiyama
2003/0156103 A1 8/2003 Ota
2003/0169244 A1 9/2003 Kurokawa et al.
2003/0189541 A1 10/2003 Hashimoto
2003/0223164 A1 12/2003 Ebara
2004/0004877 A1 1/2004 Uetake
2004/0017341 A1 1/2004 Maki
2004/0021652 A1 2/2004 Abe et al.
2004/0021947 A1 2/2004 Schofield et al.
2004/0056252 A1 3/2004 Kasai
2004/0070900 A1 4/2004 Ker et al.
2004/0095307 A1 5/2004 Kim
2004/0124472 A1 7/2004 Lin et al.
2004/0140970 A1 7/2004 Morita
2004/0164943 A1 8/2004 Ogawa et al.
2004/0174646 A1 9/2004 Ko
2004/0239606 A1 12/2004 Ota
2004/0246215 A1 12/2004 Yoo
2005/0001797 A1 1/2005 Miller et al.
2005/0001846 A1 1/2005 Shiono
2005/0045955 A1 3/2005 Kim et al.
2005/0047266 A1 3/2005 Shionori et al.
2005/0052340 A1 3/2005 Goto et al.
2005/0057580 A1* 3/2005 Yamano et al. ............... 345/690
2005/0057581 A1 3/2005 Horiuchi et al.
2005/0073470 A1 4/2005 Nose et al.
2005/0087807 A1 4/2005 Righter
2005/0093777 A1 5/2005 Kim et al.
2005/0116960 A1 6/2005 Shioda et al.
2005/0122303 A1 6/2005 Hashimoto
2005/0184979 A1 8/2005 Sakaguchi
2005/0195149 A1 9/2005 Ito
2005/0212788 A1 9/2005 Fukuda et al.
2005/0212826 A1 9/2005 Fukuda et al.
2005/0219189 A1 10/2005 Fukuo
2005/0243043 A1* 11/2005 Jeoung et al. .................. 345/87
2005/0253976 A1 11/2005 Sekiguchi et al.
2005/0262293 A1 11/2005 Yoon
2005/0270262 A1 12/2005 Oh
2005/0280613 A1* 12/2005 Takei et al. .................... 345/76
2005/0285862 A1 12/2005 Noda et al.
2006/0017681 A1 1/2006 Jang et al.
2006/0028417 A1 2/2006 Harada et al.
2006/0050042 A1 3/2006 Yi
2006/0062483 A1 3/2006 Kondo et al.
2006/0145972 A1 7/2006 Zhang et al.

| | | | | | |
|---|---|---|---|---|---|
| 2006/0244710 | A1* | 11/2006 | Iriguchi et al. | ................ | 345/100 |
| 2007/0000971 | A1 | 1/2007 | Kumagai et al. | | |
| 2007/0001886 | A1 | 1/2007 | Ito et al. | | |
| 2007/0001973 | A1 | 1/2007 | Kumagai et al. | | |
| 2007/0001982 | A1 | 1/2007 | Ito et al. | | |
| 2007/0001983 | A1 | 1/2007 | Ito et al. | | |
| 2007/0001984 | A1 | 1/2007 | Kumagai et al. | | |
| 2007/0002061 | A1* | 1/2007 | Kumagai et al. | .............. | 345/519 |
| 2007/0002188 | A1 | 1/2007 | Kumagai et al. | | |
| 2007/0002509 | A1 | 1/2007 | Kumagai et al. | | |
| 2007/0013635 | A1 | 1/2007 | Ito et al. | | |
| 2007/0013687 | A1 | 1/2007 | Kodaira et al. | | |
| 2007/0013706 | A1 | 1/2007 | Kodaira et al. | | |
| 2007/0013707 | A1 | 1/2007 | Kodaira et al. | | |
| 2007/0016700 | A1 | 1/2007 | Kodaira et al. | | |
| 2007/0035503 | A1 | 2/2007 | Kurokawa et al. | | |
| 2007/0187762 | A1 | 8/2007 | Saiki et al. | | |
| 2010/0059882 | A1 | 3/2010 | Suzuki et al. | | |
| 2010/0252924 | A1 | 10/2010 | Kanaoka et al. | | |

FOREIGN PATENT DOCUMENTS

| | | | |
|---|---|---|---|
| EP | 0 499 478 | A2 | 8/1992 |
| JP | A-56-130888 | | 10/1981 |
| JP | A 63-225993 | | 9/1988 |
| JP | A 1-171190 | | 7/1989 |
| JP | A-2-79294 | | 3/1990 |
| JP | A 4-370595 | | 12/1992 |
| JP | A 5-181154 | | 7/1993 |
| JP | A-05-189957 | | 7/1993 |
| JP | A-8-181219 | | 7/1995 |
| JP | A 7-281634 | | 10/1995 |
| JP | A 8-69696 | | 3/1996 |
| JP | A-8-236706 | | 9/1996 |
| JP | A-9-265274 | | 10/1997 |
| JP | A 11-261011 | | 9/1999 |
| JP | A 11-274424 | | 10/1999 |
| JP | A 11-330393 | | 11/1999 |
| JP | A-2000-020032 | | 1/2000 |
| JP | A-2000-252435 | | 9/2000 |
| JP | A-2001-067868 | | 3/2001 |
| JP | 2001-222249 | | 8/2001 |
| JP | A 2001-222276 | | 8/2001 |
| JP | A-2002-6334 | | 1/2002 |
| JP | A-2002-83933 | | 3/2002 |
| JP | A-2002-182232 | | 6/2002 |
| JP | A 2002-244624 | | 8/2002 |
| JP | A-2002-313925 | | 10/2002 |
| JP | A-2002-358777 | | 12/2002 |
| JP | A 2003-022063 | | 1/2003 |
| JP | A-2003-23092 | | 1/2003 |
| JP | 2003-107528 | A | 4/2003 |
| JP | A-2003-203984 | | 7/2003 |
| JP | A-2003-289104 | | 10/2003 |
| JP | A 2003-330433 | | 11/2003 |
| JP | A 2004-040042 | | 2/2004 |
| JP | A-2004-95577 | | 3/2004 |
| JP | A 2004-146806 | | 5/2004 |
| JP | A 2004-159314 | | 6/2004 |
| JP | A 2004-328456 | | 11/2004 |
| JP | A 2005-17725 | | 1/2005 |
| JP | A 2005-72607 | | 3/2005 |
| JP | A 2005-085820 | | 3/2005 |
| JP | 2005-167212 | A | 6/2005 |
| JP | A-2005-150559 | | 6/2005 |
| JP | A-2006-228770 | | 8/2006 |
| KR | A 1992-17106 | | 9/1992 |
| KR | 1999-88197 | | 12/1999 |
| KR | A 2001-100814 | | 11/2001 |
| KR | 10-2005-0011743 | | 1/2005 |
| TW | 501080 | | 9/2002 |
| TW | 522366 | | 3/2003 |
| TW | 525134 | | 3/2003 |
| TW | I224300 | | 3/2003 |
| TW | 563081 | | 11/2003 |
| WO | WO 2004-025849 | A1 | 3/2004 |

OTHER PUBLICATIONS

U.S. Appl. No. 11/270,546, filed Nov. 10, 2005 in the name of Satoru Kodaira et al.
U.S. Appl. No. 11/270,552, filed Nov. 10, 2005 in the name of Satoru Kodaira et al.
U.S. Appl. No. 11/270,694, filed Nov. 10, 2005 in the name of Satoru Kodaira et al.
U.S. Appl. No. 11/270,749, filed Nov. 10, 2005 in the name of Satoru Kodaira et al.
U.S. Appl. No. 11/270,551, filed Nov. 10, 2005 in the name of Takashi Kumagai et al.
U.S. Appl. No. 11/270,779, filed Nov. 10, 2005 in the name of Takashi Kumagai et al.
U.S. Appl. No. 11/270,585, filed Nov. 10, 2005 in the name of Takashi Kumagai et al.
U.S. Appl. No. 11/270,747, filed Nov. 10, 2005 in the name of Takashi Kumagai et al.
U.S. Appl. No. 11/270,632, filed Nov. 10, 2005 in the name of Takashi Kumagai et al.
U.S. Appl. No. 11/270,553, filed Nov. 10, 2005 in the name of Takashi Kumagai et al.
U.S. Appl. No. 11/270,631, filed Nov. 10, 2005 in the name of Takashi Kumagai et al.
U.S. Appl. No. 11/270,665, filed Nov. 10, 2005 in the name of Takashi Kumagai et al.
U.S. Appl. No. 11/270,549, filed Nov. 10, 2005 in the name of Satoru Kodaira et al.
U.S. Appl. No. 11/270,666, filed Nov. 10, 2005 in the name of Satoru Kodaira et al.
U.S. Appl. No. 11/270,630, filed Nov. 10, 2005 in the name of Satoru Kodaira et al.
U.S. Appl. No. 11/270,586, filed Nov. 10, 2005 in the name of Satoru Kodaira et al.
U.S. Appl. No. 11/270,547, filed Nov. 10, 2005 in the name of Satoru Kodaira et al.
Filed Jun. 30, 2006 in the name of Satoru Ito et al.
Filed Jun. 30, 2006 in the name of Satoru Kodaira et al.
Filed Jun. 30, 2006 in the name of Takashi Kumagai et al.
Office Action issued in JP Application No. 2006-154200 on Jun. 19, 2007 (with English translation).
U.S. Appl. No. 12/000,882, filed Dec. 18, 2007 in the name of Kodaira et al.
Sedra & Smith, Microelectronic Circuit (Jun. 1990), Saunder College Publishing, 3rd Edition, Chapter 5, p. 300.
Jan. 18, 2012 Notice of Allowance issued in U.S. Appl. No. 11/477,720.
Jul. 20, 2012 Office Action issued in U.S. Appl. No. 13/022,995.
Nov. 22, 2011 Office Action issued in Japanese Application No. 2008-035576 (with translation).
Nov. 22, 2011 Office Action issued in Japanese Application No. 2008-124746 (with translation).
Nov. 29, 2011 Office Action issued in U.S. Appl. No. 11/477,741.
Feb. 9, 2012 Notice of Allowance issued in U.S. Appl. No. 11/703,686.
U.S. Office Action dated Feb. 25, 2013 from U.S. Appl. No. 13/022,995.
Aug. 5, 2011 Notice of Allowance issued in U.S. Appl. No. 11/477,720.
Aug. 10, 2011 Notice of Allowance issued in U.S. Appl. No. 11/477,670.
Aug. 30, 2012 Office Action issued in U.S. Appl. No. 13/137,995.
Jun. 6, 2013 Office Action issued in U.S. Appl. No. 13/022,995.

* cited by examiner

FIG. 4

| | WITH MEMORY (RAM) | | WITHOUT MEMORY | | CSTN | TFD |
|---|---|---|---|---|---|---|
| | AMORPHOUS TFT | LOW-TEMPERATURE POLYSILICON TFT | AMORPHOUS TFT | LOW-TEMPERATURE POLYSILICON TFT | | |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT ($\gamma$) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

CROSS SECTION A-B

CROSS SECTION C-D $$(NP-1)\times PP < WDB+WMB+WAB < (NP+1)\times PP$$

$$WDB+WMB+WAB \leqq NP\times PP$$

INTEGRATED CIRCUIT DEVICE AND ELECTRONIC INSTRUMENT

Japanese Patent Application No. 2005-192479, filed on Jun. 30, 2005, Japanese Patent Application No. 2005-253389, filed on Sep. 1, 2005, and Japanese Patent Application No. 2006-34499, filed on Feb. 10, 2006, are hereby incorporated by reference in their entirety.

BACKGROUND OF THE INVENTION

The present invention relates to an integrated circuit device and an electronic instrument.

A display driver (LCD driver) is an example of an integrated circuit device which drives a display panel such as a liquid crystal panel (JP-A-2001-222249). A reduction in the chip size is required for the display driver in order to reduce cost.

However, the size of the display panel incorporated in a portable telephone or the like is almost constant. Therefore, if the chip size is reduced by merely shrinking the integrated circuit device as the display driver by using a microfabrication technology, it becomes difficult to mount the integrated circuit device.

SUMMARY

A first aspect of the invention relates to an integrated circuit device comprising:

at least one data driver block for driving data lines;

a plurality of control transistors, each of the control transistors being provided corresponding to each output line of the data driver block and controlled by using a common control signal; and a pad arrangement region in which data driver pads for electrically connecting the data lines and the output lines of the data driver block are disposed;

the control transistors being disposed in the pad arrangement region.

A second aspect of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region which is disposed along the fourth side on the second direction side of the first to Nth circuit blocks and serves as a pad arrangement region;

a second interface region which is disposed along the second side and on a fourth direction side of the first to Nth circuit blocks and serves as a pad arrangement region, the fourth direction being opposite to the second direction; and the first to Nth circuit blocks including at least one data driver block for driving data lines, data driver pads for electrically connecting the data lines and output lines of the data driver block, and a plurality of control transistors, each of the control transistors being provided corresponding to each output line of the data driver block and controlled using a common control signal, being disposed in the first interface region.

A third aspect of the invention relates to an electronic instrument comprising:

the above integrated circuit device; and a display panel driven by the integrated circuit device.

BRIEF DESCRIPTION OF THE SEVERAL VIEWS OF THE DRAWING

FIG. 4 is an example of various types of display drivers and circuit blocks provided in the display drivers.

DETAILED DESCRIPTION OF THE EMBODIMENT

Figure 1A:
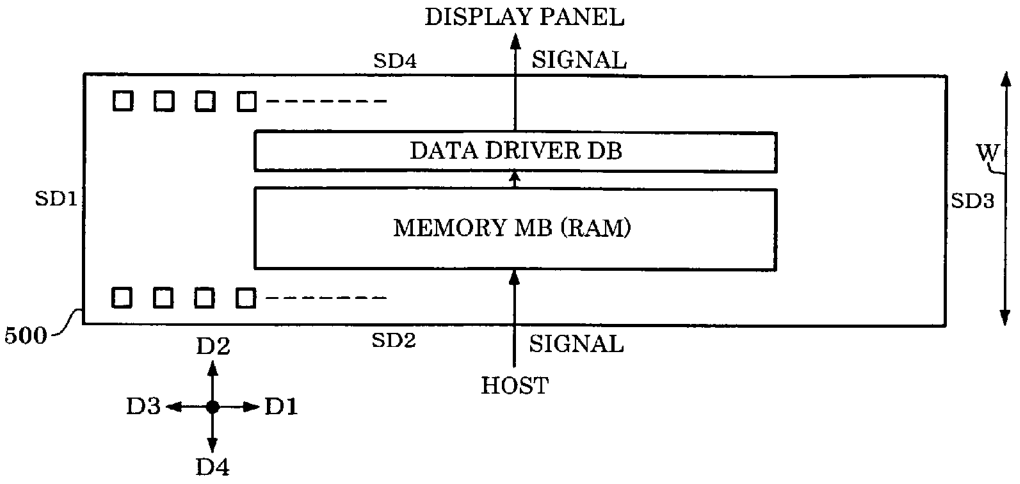
FIGS. 1A, 1B, and 1C are illustrative of a comparative example of one embodiment of the invention.

The invention may provide an integrated circuit device which can reduce the circuit area, and an electronic instrument including the same.

One embodiment of the invention relates to an integrated circuit device comprising:

at least one data driver block for driving data lines;

a plurality of control transistors, each of the control transistors being provided corresponding to each output line of the data driver block and controlled by using a common control signal; and a pad arrangement region in which data driver pads for electrically connecting the data lines and the output lines of the data driver block are disposed;

the control transistors being disposed in the pad arrangement region.

According to this embodiment, each control transistor is provided corresponding to each output line of the data driver block, and each control transistor is controlled using the common control signal. The control transistors are disposed in the pad arrangement region. Since the control transistors are controlled using the common control signal, the wiring region is not increased to a large extent even if the control transistors are disposed in the pad arrangement region. Therefore, the control transistors can be disposed by effectively utilizing the pad arrangement region, whereby the area of the integrated circuit device can be reduced.

In the integrated circuit device according to this embodiment, the common control signal may be input to a gate of the control transistor, and the output line of the data driver block may be connected with a drain of the control transistor.

The potential of the output line of the data driver block and the like can be controlled using the common control signal by using such a control transistor. Moreover, when such a control transistor is disposed in the pad arrangement region, an increase in the area of the integrated circuit device can be minimized.

In the integrated circuit device according to this embodiment, a common potential may be supplied to a source of the control transistor, and the output line of the data driver block may be set at the common potential when the common control signal is active.

The output line of the data driver block can be set at the common potential using the common control signal by using such a control transistor. Moreover, when such a control transistor is disposed in the pad arrangement region, an increase in the area of the integrated circuit device can be minimized.

In the integrated circuit device according to this embodiment, the control transistor may be a discharge transistor which sets the output line of the data driver block at a ground potential when a discharge signal which is the common control signal has become active.

A problem caused by residual electric charge in the data line and the like can be prevented while reducing the area of the integrated circuit device by disposing such a discharge transistor in the pad arrangement region as the control transistor.

In the integrated circuit device according to this embodiment, the control transistor may be disposed in a lower layer of the data driver pad so that the control transistor at least partially overlaps the data driver pad.

This allows the control transistors to be disposed by effectively utilizing the region in the lower layer of the pads, whereby the area of the integrated circuit device can be reduced.

The integrated circuit device according to this embodiment may comprise: an operational amplifier for performing impedance conversion of a data signal output to the data line; wherein transistors forming a differential section and a driver section of the operational amplifier may be disposed in the data driver block.

This prevents a situation in which the wiring region is unnecessarily increased.

The integrated circuit device according to this embodiment may comprise: an electrostatic protection element connected with the output line of the data driver block and disposed in the pad arrangement region; wherein, when a direction in which the data lines are arranged is a first direction and a direction perpendicular to the first direction is a second direction, the control transistor may be disposed on the second direction side of the data driver block, and the electrostatic protection element may be disposed on the second direction side of the control transistor.

This reduces the area of the integrated circuit device while preventing electrostatic destruction of the control transistor.

In the integrated circuit device according to this embodiment, the pad arrangement region may include a plurality of arrangement areas arranged along the first direction; and K (K is an integer of two or more) of the data driver pads arranged along the second direction and K of the electrostatic protection elements each of which is connected with each of the K data driver pads may be disposed in each of the arrangement areas.

This allows the data driver pads and the electrostatic protection elements to be efficiently disposed in each arrangement area corresponding to the pad pitch.

In the integrated circuit device according to this embodiment, the K data driver pads arranged along the second direction may be disposed so that center positions of the data driver pads are displaced from each other in the first direction.

This allows a large number of data driver pads to be disposed along the first direction.

In the integrated circuit device according to this embodiment, a first electrostatic protection element of the K electrostatic protection elements may include: a first diode provided between a high-potential-side power supply and a first output line of the data driver block; and a second diode provided between a low-potential-side power supply and the first output line of the data driver block; a second electrostatic protection element of the K electrostatic protection elements may include: a third diode provided between the high-potential-side power supply and a second output line of the data driver block; and a fourth diode provided between the low-potential-side power supply and the second output line of the data driver block; and the first, second, third, and fourth diodes may be disposed along the second direction in each of the arrangement areas.

The width of the arrangement area in the first direction can be reduced by disposing the first to fourth diodes in this manner, whereby a narrow pad pitch can be dealt with.

In the integrated circuit device according to this embodiment, the first and third diodes may be formed in a first well region; the second and fourth diodes may be formed in a second well region; and the first and second well regions may be isolated in the second direction.

This reduces the width of the arrangement area in the first direction, whereby a narrow pad pitch can be dealt with.

In the integrated circuit device according to this embodiment, the electrostatic protection element may include a diffusion region of which a long side extends along the first direction and a short side extends along the second direction.

This makes it possible to increase the width of a connection line connected to the pad, whereby the wiring impedance can be reduced.

The integrated circuit device according to this embodiment may comprise: a power supply protection circuit provided between a high-potential-side power supply and a low-potential-side power supply; wherein the power supply protection circuit may be disposed on the second direction side of the electrostatic protection element.

This allows the power supply protection circuit to be efficiently arranged even when the power supply protection circuit has a large circuit scale.

The integrated circuit device according to this embodiment may comprise: a memory block which stores image data used by the data driver block; and a pad block in which the data driver pads and the control transistors are disposed; wherein the data driver block, the memory block, and the pad block may be integrated into a macrocell as a driver macrocell; wherein the data driver block and the memory block may be disposed along a first direction; and wherein the pad block may be disposed on the second direction side of the data driver block and the memory block, the second direction being perpendicular to the first direction.

By integrating the data driver block, the pad block, and the like into a macrocell, a completed macrocell formed by routing the output lines of the data driver block to the pads by a manual layout can be used as the driver macrocell, for example. Therefore, the output line wiring region can be reduced, whereby the area of the integrated circuit device can be reduced.

In the integrated circuit device according to this embodiment, the data driver block may include a plurality of subpixel driver cells, each of the subpixel driver cells outputting a data signal corresponding to image data of one subpixel, and the subpixel driver cells may be disposed in the data driver block along a first direction and a second direction perpendicular to the first direction.

A layout can be flexibly designed corresponding to the specification of the data driver by disposing the subpixel driver cells in a matrix.

Another embodiment of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region which is disposed along the fourth side on the second direction side of the first to Nth circuit blocks and serves as a pad arrangement region;

a second interface region which is disposed along the second side and on a fourth direction side of the first to Nth circuit blocks and serves as a pad arrangement region, the fourth direction being opposite to the second direction; and the first to Nth circuit blocks including at least one data driver block for driving data lines, data driver pads for electrically connecting the data lines and output lines of the data driver block, and a plurality of control transistors, each of the control transistors being provided corresponding to each output line of the data driver block and controlled using a common control signal, being disposed in the first interface region.

According to this embodiment, since the first to Nth circuit blocks are disposed along the first direction, the width of the integrated circuit device in the second direction can be reduced, whereby a narrow integrated circuit device can be provided. According to this embodiment, since the control transistors can be disposed by effectively utilizing the pad arrangement region, the area of the integrated circuit device can be further reduced in the second direction.

A further embodiment of the invention relates to an electronic instrument comprising:

the above integrated circuit device: and a display panel driven by the integrated circuit device.

These embodiments of the invention will be described in detail below. Note that the embodiments described below do not in any way limit the scope of the invention laid out in the claims herein. In addition, not all of the elements of the embodiments described below should be taken as essential requirements of the invention.

1. Comparative Example

FIG. 1A shows an integrated circuit device 500 which is a comparative example of one embodiment of the invention. The integrated circuit device 500 shown in FIG. 1A includes a memory block MB (display data RAM) and a data driver block DB. The memory block MB and the data driver block DB are disposed along a direction D2. The memory block MB and the data driver block DB are ultra-flat blocks of which the length along a direction D1 is longer than the width in the direction D2.

Image data supplied from a host is written into the memory block MB. The data driver block DB converts the digital image data written into the memory block MB into an analog data voltage, and drives data lines of a display panel. In FIG. 1A, the image data signal flows in the direction D2. Therefore, in the comparative example shown in FIG. 1A, the memory block MB and the data driver block DB are disposed along the direction D2 corresponding to the signal flow. This reduces the path between the input and the output so that a signal delay can be optimized, whereby an efficient signal transmission can be achieved.

However, the comparative example shown in FIG. 1A has the following problems.

Figure 2A:
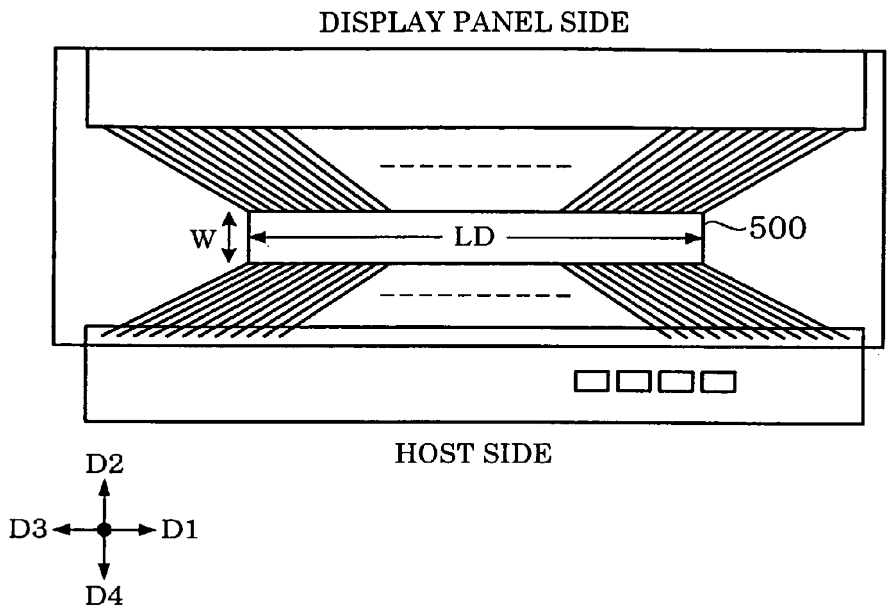
FIGS. 2A and 2B are illustrative of mounting of an integrated circuit device.

First, a reduction in the chip size is required for an integrated circuit device such as a display driver in order to reduce cost. However, if the chip size is reduced by merely shrinking the integrated circuit device 500 by using a microfabrication technology, the size of the integrated circuit device 500 is reduced not only in the short side direction but also in the long side direction. Therefore, it becomes difficult to mount the integrated circuit device 500 as shown in FIG. 2A. Specifically, it is desirable that the output pitch be 22 μm or more, for example. However, the output pitch is reduced to 17 μm by merely shrinking the integrated circuit device 500 as shown in FIG. 2A, for example, whereby it becomes difficult to mount the integrated circuit device 500 due to the narrow pitch. Moreover, the number of glass substrates obtained is decreased due to an increase in the glass frame of the display panel, whereby cost is increased.

Figure 1B:
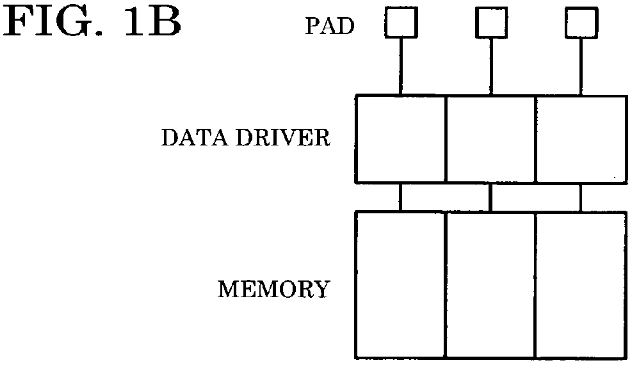
Figure 1C:
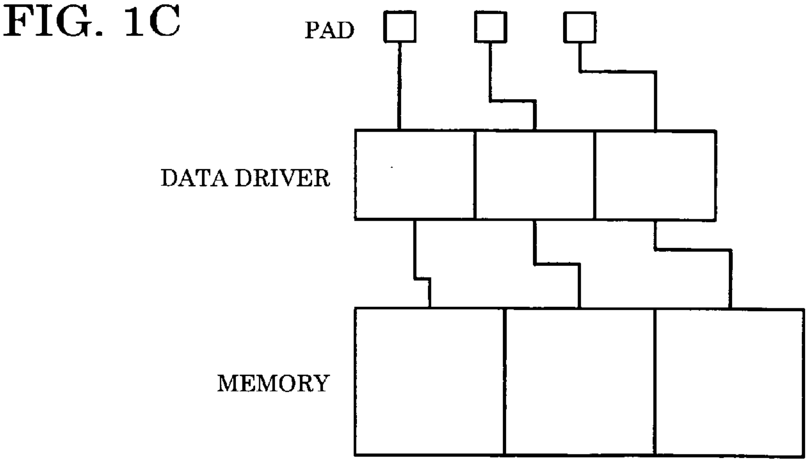

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the comparative example shown in FIG. 1A, even if the pad pitch, the cell pitch of the memory, and the cell pitch of the data driver coincide in one product as shown in FIG. 1B, the pitches do not coincide as shown in FIG. 1C when the configurations of the memory and the data driver are changed. If the pitches do not coincide as shown in FIG. 1C, an unnecessary interconnect region for absorbing the pitch difference must be formed between the circuit blocks. In particular, in the comparative example shown in FIG. 1A in which the block is made flat in the direction D1, the area of an unnecessary interconnect region for absorbing the pitch difference is increased. As a result, the width W of the integrated circuit device 500 in the direction D2 is increased, whereby cost is increased due to an increase in the chip area.

If the layout of the memory and the data driver is changed so that the pad pitch coincides with the cell pitch in order to avoid such a problem, the development period is increased, whereby cost is increased. Specifically, since the circuit configuration and the layout of each circuit block are individually designed and the pitch is adjusted thereafter in the comparative example shown in FIG. 1A, unnecessary area is provided or the design becomes inefficient.

2. Configuration of Integrated Circuit Device

Figure 3:
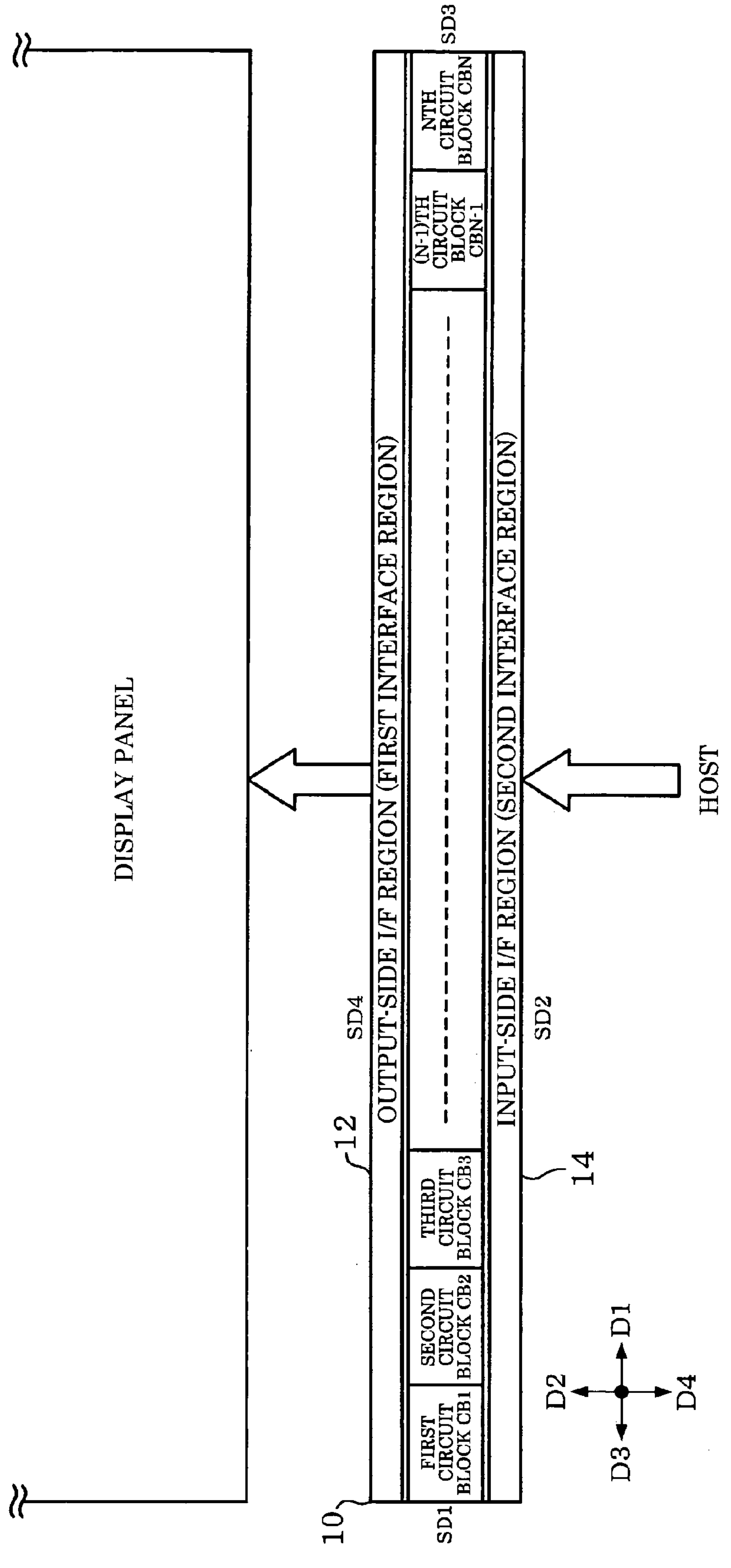
FIG. 3 is a configuration example of an integrated circuit device according to embodiment of the invention.

FIG. 3 shows a configuration example of an integrated circuit device 10 of one embodiment of the invention which can solve the above-described problems. In this embodiment, the direction from a first side SD1 (short side) of the integrated circuit device 10 toward a third side SD3 opposite to the first side SD1 is defined as a first direction D1, and the direction opposite to the first direction D1 is defined as a third direction D3. The direction from a second side SD2 (long side) of the integrated circuit device 10 toward a fourth side SD4 opposite to the second side SD2 is defined as a second direction D2, and the direction opposite to the second direction D2 is defined as a fourth direction D4. In FIG. 3, the left side of the integrated circuit device 10 is the first side SD1, and the right side is the third side SD3. However, the left side may be the third side SD3, and the right side may be the first side SD1.

As shown in FIG. 3, the integrated circuit device 10 according to this embodiment includes first to Nth circuit blocks CB1 to CBN (N is an integer larger than one) disposed along the direction D1. Specifically, while the circuit blocks are arranged in the direction D2 in the comparative example shown in FIG. 1A, the circuit blocks CB1 to CBN are arranged in the direction D1 in this embodiment. Each circuit block is a relatively square block differing from the ultra-flat block as in the comparative example shown in FIG. 1A.

The integrated circuit device 10 includes an output-side I/F region 12 (first interface region in a broad sense) provided along the side SD4 and on the D2 side of the first to Nth circuit blocks CB1 to CBN. The integrated circuit device 10 includes an input-side I/F region 14 (second interface region in a broad sense) provided along the side SD2 and on the D4 side of the first to Nth circuit blocks CB1 to CBN. In more detail, the output-side I/F region 12 (first I/O region) is disposed on the D2 side of the circuit blocks CB1 to CBN without other circuit blocks interposed therebetween, for example. The input-side I/F region 14 (second I/O region) is disposed on the D4 side of the circuit blocks CB1 to CBN without other circuit blocks interposed therebetween, for example. Specifically, only one circuit block (data driver block) exists in the direction D2 at least in the area in which the data driver block exists. When the integrated circuit device 10 is used as an intellectual property (IP) core and incorporated in another integrated circuit device, the integrated circuit device 10 may be configured to exclude at least one of the I/F regions 12 and 14.

The output-side (display panel side) I/F region 12 is a region which serves as an interface between the integrated circuit device 10 and the display panel, and includes pads and various elements such as output transistors and protective elements connected with the pads. In more detail, the output-side I/F region 12 includes output transistors for outputting data signals to data lines and scan signals to scan lines, for example. When the display panel is a touch panel, the output-side I/F region 12 may include input transistors.

The input-side I/F region 14 is a region which serves as an interface between the integrated circuit device 10 and a host (MPU, image processing controller, or baseband engine), and may include pads and various elements connected with the pads, such as input (input-output) transistors, output transistors, and protective elements. In more detail, the input-side I/F region 14 includes input transistors for inputting signals (digital signals) from the host, output transistors for outputting signals to the host, and the like.

An output-side or input-side I/F region may be provided along the short side SD1 or SD3. Bumps which serve as external connection terminals may be provided in the I/F (interface) regions 12 and 14, or may be provided in other regions (first to Nth circuit blocks CB1 to CBN). When providing the bumps in the region other than the I/F regions 12 and 14, the bumps are formed by using a small bump technology (e.g. bump technology using resin core) other than a gold bump technology.

The first to Nth circuit blocks CB1 to CBN may include at least two (or three) different circuit blocks (circuit blocks having different functions). Taking an example in which the integrated circuit device 10 is a display driver, the circuit blocks CB1 to CBN may include at least two of a data driver block, a memory block, a scan driver block, a logic circuit block, a grayscale voltage generation circuit block, and a power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 4 shows an example of various types of display drivers and circuit blocks provided in the display drivers. In an amorphous thin film transistor (TFT) panel display driver including a built-in memory (RAM), the circuit blocks CB1 to CBN include a memory block, a data driver (source driver) block, a scan driver (gate driver) block, a logic circuit (gate array circuit) block, a grayscale voltage generation circuit (γ-correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a color super twisted nematic (CSTN) panel display driver and a thin film diode (TFD) panel display driver, the grayscale voltage generation circuit block may be omitted.

Figure 5A:
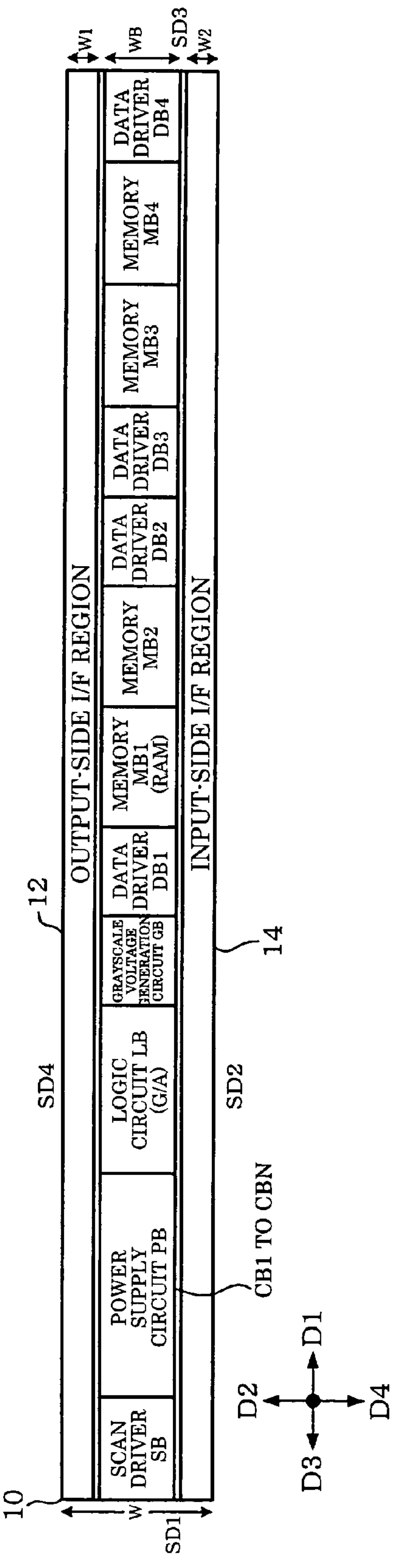
FIGS. 5A and 5B are planar layout examples of the integrated circuit device according to embodiment of the invention.
Figure 5B:
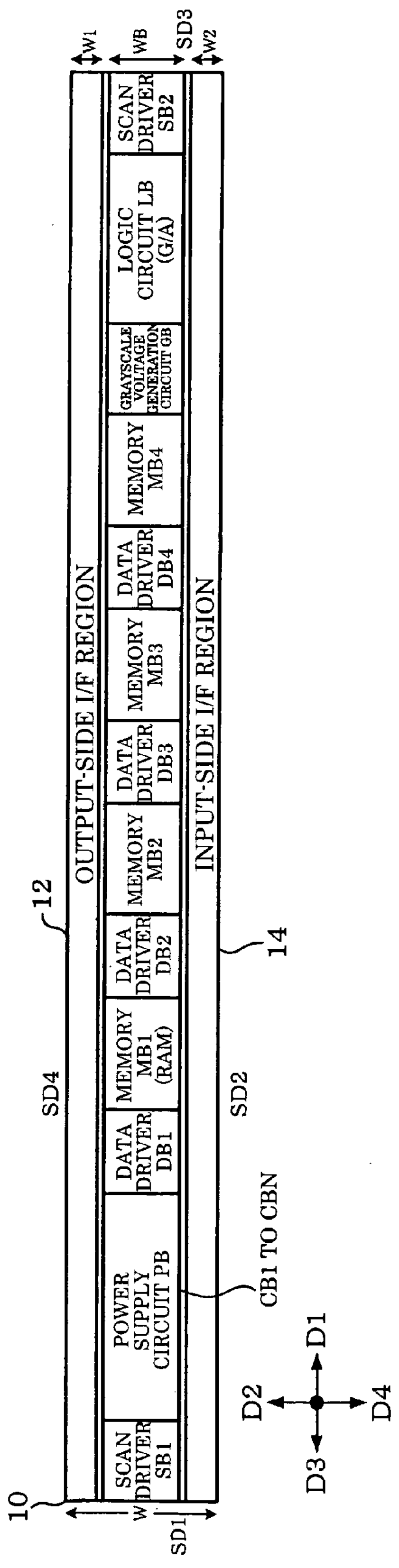

FIGS. 5A and 5B show examples of a planar layout of the integrated circuit device 10 as the display driver according to this embodiment. FIGS. 5A and 5B are examples of an amorphous TFT panel display driver including a built-in memory. FIG. 5A shows a QCIF and 32-grayscale display driver, and FIG. 5B shows a QVGA and 64-grayscale display driver.

In FIGS. 5A and 5B, the first to Nth circuit blocks CB1 to CBN include first to fourth memory blocks MB1 to MB4 (first to Ith memory blocks in a broad sense; I is an integer larger than one). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are disposed adjacent to each other along the direction D1, and the memory block MB2 and the data driver block DB2 are disposed adjacent to each other along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

In FIG. 5A, the data driver block DB1 (Jth data driver block in a broad sense; 1≤J<I) of the data driver blocks DB1 to DB4 is disposed adjacently on the D3 side of the memory block MB1 (Jth memory block in a broad sense) of the memory blocks MB1 to MB4. The memory block MB2 ((J+1)th memory block in a broad sense) is disposed adjacently on the D1 side of the memory block MB1. The data driver block DB2 ((J+1)th data driver block in a broad sense) is disposed adjacently on the D1 side of the memory block MB2. The arrangement of the memory blocks MB3 and MB4 and the data driver blocks DB3 and DB4 is the same as described above. In FIG. 5A, the memory block MB1 and the data driver block DB1 and the memory block MB2 and the data driver block DB2 are disposed line-symmetrical with respect to the borderline between the memory blocks MB1 and MB2, and the memory block MB3 and the data driver block DB3 and the memory block MB4 and the data driver block DB4 are disposed line-symmetrical with respect to the borderline between the memory blocks MB3 and MB4. In FIG. 5A, the data driver blocks DB2 and DB3 are disposed adjacent to each other. However, another circuit block may be disposed between the data driver blocks DB2 and DB3.

In FIG. 5B, the data driver block DB1 (Jth data driver block) of the data driver blocks DB1 to DB4 is disposed adjacently on the D3 side of the memory block MB1 (Jth memory block) of the memory blocks MB1 to MB4. The data driver block DB2 ((J+1)th data driver block) is disposed on the D1 side of the memory block MB1. The memory block MB2 ((J+1)th memory block) is disposed on the D1 side of the data driver block DB2. The data driver block DB3, the memory block MB3, the data driver block DB4, and the memory block MB4 are disposed in the same manner as described above. In FIG. 5B, the memory block MB1 and the data driver block DB2, the memory block MB2 and the data driver block DB3, and the memory block MB3 and the data driver block DB4 are respectively disposed adjacent to each other. However, another circuit block may be disposed between these blocks.

The layout arrangement shown in FIG. 5A has an advantage in that a column address decoder can be used in common between the memory blocks MB1 and MB2 or the memory blocks MB3 and MB4 (between the Jth and (J+1)th memory blocks). The layout arrangement shown in FIG. 5B has an advantage in that the interconnect pitch of the data signal output lines from the data driver blocks DB1 to DB4 to the output-side I/F region 12 can be equalized so that the interconnect efficiency can be increased.

The layout arrangement of the integrated circuit device 10 according to this embodiment is not limited to those shown in FIGS. 5A and 5B. For example, the number of memory blocks and data driver blocks may be set at 2, 3, or 5 or more, or the memory block and the data driver block may not be divided into blocks. A modification in which the memory block is not disposed adjacent to the data driver block is also possible. A configuration is also possible in which the memory block, the scan driver block, the power supply circuit block, or the grayscale voltage generation circuit block is not provided. A circuit block having a width significantly small in the direction D2 (narrow circuit block having a width less than the width WB) may be provided between the circuit blocks CB1 to CBN and the output-side I/F region 12 or the input-side I/F region 14. The circuit blocks CB1 to CBN may include a circuit block in which different circuit blocks are arranged in stages in the direction D2. For example, the scan driver circuit and the power supply circuit may be formed in one circuit block.

Figure 6A:
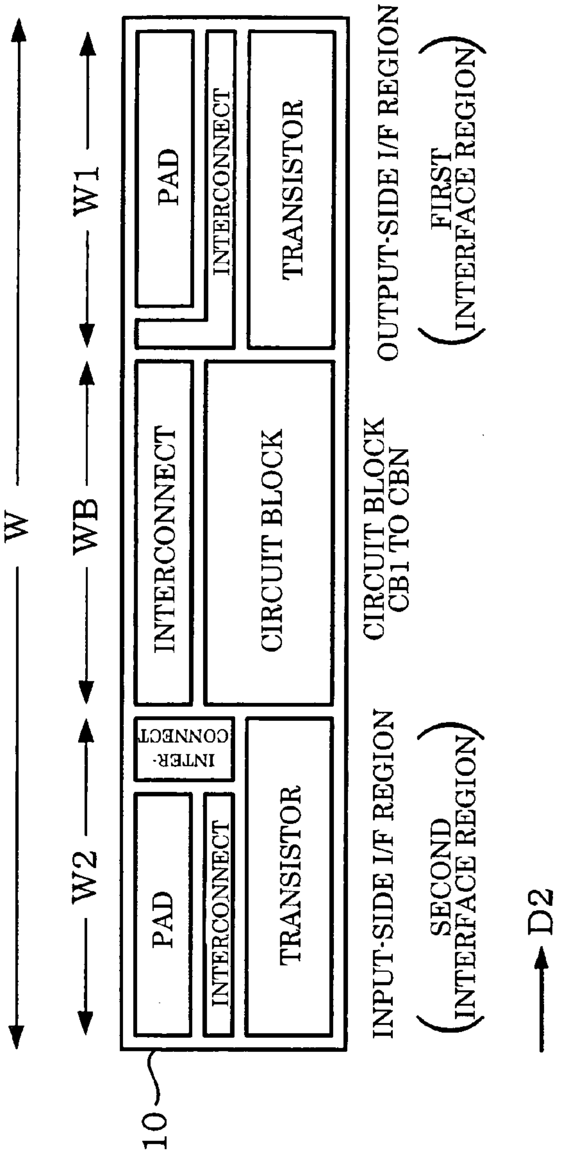
FIGS. 6A and 6B are examples of cross-sectional views of the integrated circuit device.

FIG. 6A shows an example of a cross-sectional view of the integrated circuit device 10 according to this embodiment along the direction D2, W1, WB, and W2 respectively indicate the widths of the output-side I/F region 12, the circuit blocks CB1 to CBN, and the input-side I/F region 14 in the direction D2. W indicates the width of the integrated circuit device 10 in the direction D2.

In this embodiment, as shown in FIG. 6A, a configuration may be employed in which a circuit blocks is not provided between the circuit blocks CB1 to CBN (data driver block DB) and the output-side I/F region 12 or input-side I/F region 14. Therefore, the relationship "$W1+WB+W2 \leq W < W1+2\times WB+W2$" is satisfied so that a slim integrated circuit device can be realized. In more detail, the width W in the direction D2 may be set at "W<2 mm". More specifically, the width W in the direction D2 may be set at "W<1.5 mm". It is preferable that "W>0.9 mm" taking inspection and mounting of the chip into consideration. A length LD in the long side direction may be set at "15 mm<LD<27 mm". A chip shape ratio SP (=LD/W) may be set at "SP>10". More specifically, the chip shape ratio SP may be set at "SP>12".

The widths W1, WB, and W2 shown in FIG. 6A indicate the widths of transistor formation regions (bulk regions or active regions) of the output-side I/F region 12, the circuit blocks CB1 to CBN, and the input-side I/F region 14, respectively. Specifically, output transistors, input transistors, input-output transistors, transistors of electrostatic protection elements, and the like are formed in the I/F regions 12 and 14. Transistors which form circuits are formed in the circuit blocks CB1 to CBN. The widths W1, WB, and W2 are determined based on well regions and diffusion regions by which such transistors are formed. In order to realize a slim integrated circuit device, it is preferable to form bumps (active surface bumps) on the transistors of the circuit blocks CB1 to CBN. In more detail, a resin core bump in which the core is formed of a resin and a metal layer is formed on the surface of the resin or the like is formed above the transistor (active region). These bumps (external connection terminals) are connected with the pads disposed in the I/F regions 12 and 14 through metal interconnects. The widths W1, WB, and W2 according to this embodiment are not the widths of the bump formation regions, but the widths of the transistor formation regions formed under the bumps.

The widths of the circuit blocks CB1 to CBN in the direction D2 may be identical, for example. In this case, it suffices that the width of each circuit block be substantially identical, and the width of each circuit block may differ in the range of several to 20 μm (several tens of microns), for example. When a circuit block with a different width exists in the circuit blocks CB1 to CBN, the width WB may be the maximum width of the circuit blocks CB1 to CBN. In this case, the maximum width may be the width of the data driver block in the direction D2, for example. In the case where the integrated circuit device includes a memory, the maximum width may be the width of the memory block in the direction D2. A vacant region having a width of about 20 to 30 μm may be provided between the circuit blocks CB1 to CBN and the I/F regions 12 and 14, for example.

In this embodiment, a pad of which the number of stages in the direction D2 is one or more may be disposed in the output-side I/F region 12. Therefore, the width W1 of the output-side I/F region 12 in the direction D2 may be set at "0.13 mm≤W1≤0.4 mm" taking the pad width (e.g. 0.1 mm) and the pad pitch into consideration. Since a pad of which the number of stages in the direction D2 is one can be disposed in the input-side I/F region 14, the width W2 of the input-side I/F region 14 may be set at "0.1 mm≤W2≤0.2 mm". In order to realize a slim integrated circuit device, interconnects for logic signals from the logic circuit block, grayscale voltage signals from the grayscale voltage generation circuit block, and a power supply must be formed on the circuit blocks CB1 to CBN by using global interconnects. The total width of these interconnects is about 0.8 to 0.9 mm, for example. Therefore, the widths WB of the circuit blocks CB1 to CBN may be set at "0.65 mm≤WB≤1.2 mm" taking the total width of these interconnects into consideration.

Since "0.65 mm≤WB≤1.2 mm" is satisfied even if W1=0.4 mm and W2=0.2 mm, WB>W1+W2 is satisfied. When the widths W1, WB, and W2 are minimum values, W1=0.13 mm, WB=0.65 mm, and W2=0.1 mm so that the width W of the integrated circuit device is about 0.88 mm. Therefore, "W=0.88 mm<2×WB=1.3 mm" is satisfied. When the widths W1, WB, and W2 are maximum values, W1=0.4 mm, WB=1.2 mm, and W2=0.2 mm so that the width W of the integrated circuit device is about 1.8 mm. Therefore, "W=1.8 mm<2×WB=2.4 mm" is satisfied. Therefore, the relational equation "W<2×WB" is satisfied so that a slim integrated circuit device is realized.

Figure 6B:
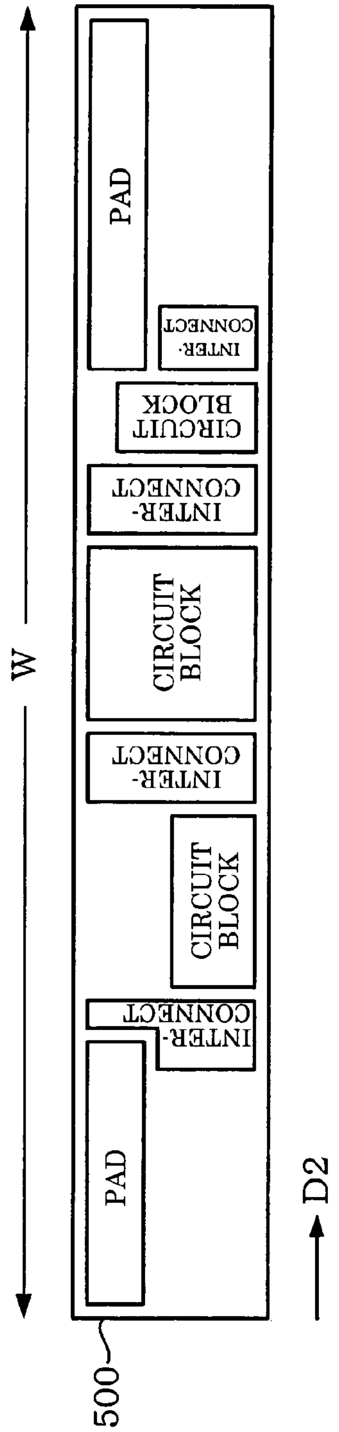

In the comparative example shown in FIG. 1A, two or more circuit blocks are disposed along the direction D2 as shown in FIG. 6B. Moreover, interconnect regions are formed between the circuit blocks and between the circuit blocks and the I/F region in the direction D2. Therefore, since the width W of the integrated circuit device 500 in the direction D2 (short side direction) is increased, a slim chip cannot be realized. Therefore, even if the chip is shrunk by using a microfabrication technology, the length LD in the direction D1 (long side direction) is decreased, as shown in FIG. 2A, so that the output pitch becomes narrow, whereby it becomes difficult to mount the integrated circuit device 500.

Figure 2B:
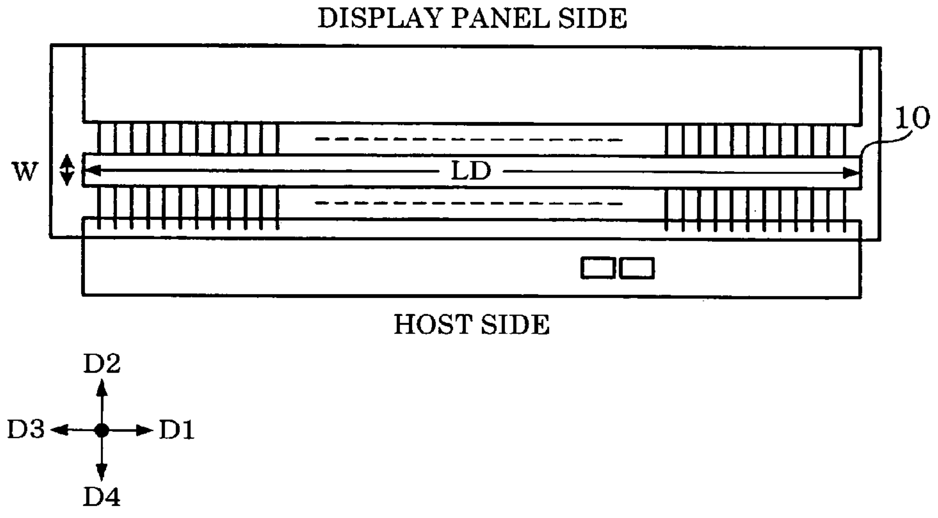

In this embodiment, the circuit blocks CB1 to CBN are disposed along the direction D1 as shown in FIGS. 3, 5A, and 5B. As shown in FIG. 6A, the transistor (circuit element) can be disposed under the pad (bump) (active surface bump). Moreover, the signal lines can be formed between the circuit blocks and between the circuit blocks and the I/F by using the global interconnects formed in the upper layer (lower layer of the pad) of the local interconnects in the circuit blocks. Therefore, since the width W of the integrated circuit device 10 in the direction D2 can be reduced while maintaining the length LD of the integrated circuit device 10 in the direction D1 as shown in FIG. 2B, a very slim chip can be realized. As a result, since the output pitch can be maintained at 22 μm or more, for example, mounting can be facilitated.

In this embodiment, since the circuit blocks CB1 to CBN are disposed along the direction D1, it is possible to easily deal with a change in the product specifications and the like. Specifically, since product of various specifications can be designed by using a common platform, the design efficiency can be increased. For example, when the number of pixels or the number of grayscales of the display panel is increased or decreased in FIGS. 5A and 5B, it is possible to deal with such a situation merely by increasing or decreasing the number of blocks of memory blocks or data driver blocks, the number of readings of image data in one horizontal scan period, or the like. FIGS. 5A and 5B show an example of an amorphous TFT panel display driver including a memory. When developing a low-temperature polysilicon TFT panel product including a memory, it suffices to remove the scan driver block from the circuit blocks CB1 to CBN. When developing a product which does not include a memory, it suffices to remove the memory block from the circuit blocks CB1 to CBN. In this embodiment, even if the circuit block is removed corresponding to the specification, since the effect on the remaining circuit blocks is minimized, the design efficiency can be increased.

In this embodiment, the widths (heights) of the circuit blocks CB1 to CBN in the direction D2 can be uniformly adjusted to the width (height) of the data driver block or the memory block, for example. Since it is possible to deal with an increase or decrease in the number of transistors of each circuit block by increasing or decreasing the length of each circuit block in the direction D1, the design efficiency can be further increased. For example, when the number of transistors is increased or decreased in FIGS. 5A and 5B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

As a second comparative example, a narrow data driver block may be disposed in the direction D1, and other circuit blocks such as the memory block may be disposed along the direction D1 on the D4 side of the data driver block, for example. However, in the second comparative example, since the data driver block having a large width lies between other circuit blocks such as the memory block and the output-side I/F region, the width W of the integrated circuit device in the direction D2 is increased, so that it is difficult to realize a slim chip. Moreover, an additional interconnect region is formed between the data driver block and the memory block, whereby the width W is further increased. Furthermore, when the configuration of the data driver block or the memory block is changed, the pitch difference described with reference to FIGS. 1B and 1C occurs, whereby the design efficiency cannot be increased.

As a third comparative example of this embodiment, only circuit blocks (e.g. data driver blocks) having the same function may be divided and arranged in the direction D1. However, since the integrated circuit device can be provided with only a single function (e.g. function of the data driver) in the third comparative example, development of various products cannot be realized. In this embodiment, the circuit blocks CB1 to CBN include circuit blocks having at least two different functions. Therefore, various integrated circuit devices corresponding to various types of display panels can be provided as shown in FIGS. 4, 5A, and 5B.

3. Circuit Configuration

Figure 7:
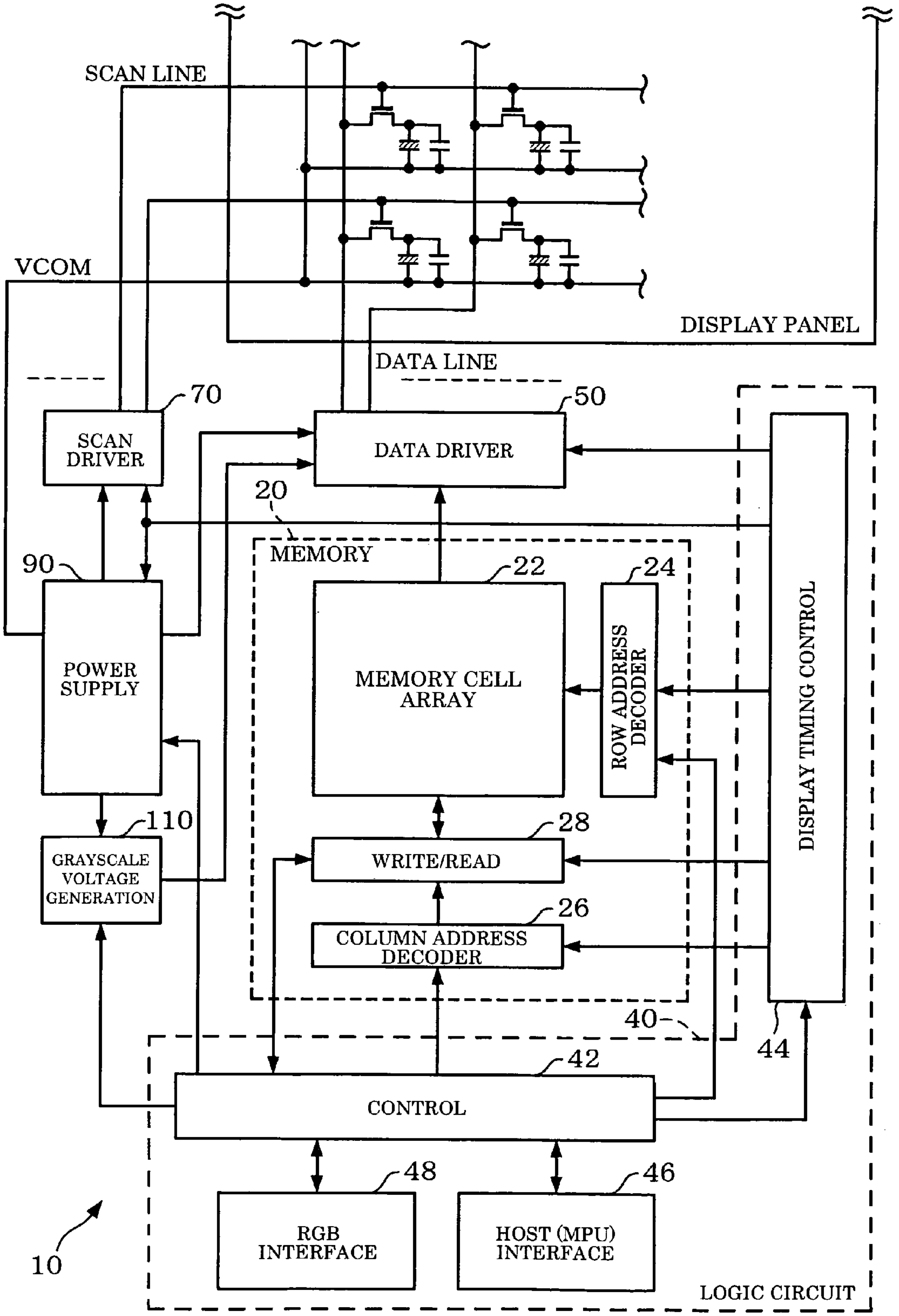
FIG. 7 is a circuit configuration example of the integrated circuit device.

FIG. 7 shows a circuit configuration example of the integrated circuit device 10. The circuit configuration of the integrated circuit device 10 is not limited to the circuit configuration shown in FIG. 7. Various modifications and variations may be made. A memory 20 (display data RAM) stores image data. A memory cell array 22 includes a plurality of memory cells, and stores image data (display data) for at least one frame (one screen). In this case, one pixel is made up of R, G, and B subpixels (three dots), and 6-bit (k-bit) image data is stored for each subpixel, for example. A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. An access region of the memory cell array 22 is defined by a rectangle having a start address and an end address as opposite vertices. Specifically, the access region is defined by the column address and the row address of the start address and the column address and the row address of the end address so that memory access is performed.

A logic circuit 40 (e.g. automatic placement and routing circuit) generates a control signal for controlling display timing, a control signal for controlling data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (γ-characteristic) adjustment data (γ-correction data) to a grayscale voltage generation circuit 110 and controls voltage generation of a power supply circuit 90. The control circuit 42 controls write/read processing for the memory using the row address decoder 24, the column address decoder 26, and the write/read circuit 28. A display timing control circuit 44 generates various control signals for controlling display timing, and controls reading of image data from the memory into the display panel. A host (MPU) interface circuit 46 realizes a host interface which accesses the memory by generating an internal pulse each time accessed by the host. An RGB interface circuit 48 realizes an RGB interface which writes motion picture RGB data into the memory based on a dot clock signal. The integrated circuit device 10 may be configured to include only one of the host interface circuit 46 and the RGB interface circuit 48.

In FIG. 7, the host interface circuit 46 and the RGB interface circuit 48 access the memory 20 in pixel units. Image data designated by a line address and read in line units is supplied to a data driver 50 in line cycle at an internal display timing independent of the host interface circuit 46 and the RGB interface circuit 48.

Figure 8A:
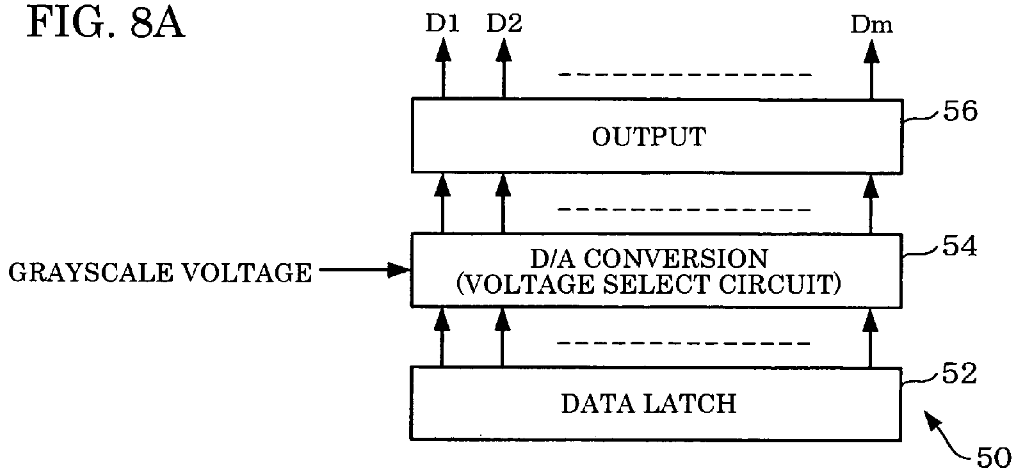
FIGS. 8A, 8B, and 8C are illustrative of configuration examples of a data driver and a scan driver.

The data driver 50 is a circuit for driving a data line of the display panel. FIG. 8A shows a configuration example of the data driver 50. A data latch circuit 52 latches the digital image data from the memory 20. A D/A conversion circuit 54 (voltage select circuit) performs D/A conversion of the digital image data latched by the data latch circuit 52, and generates an analog data voltage. In more detail, the D/A conversion circuit 54 receives a plurality of (e.g. 64 stages) grayscale voltages (reference voltages) from the grayscale voltage generation circuit 110, selects a voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. A part of the output circuit 56 (e.g. output stage of operational amplifier) may not be included in the data driver 50 and may be disposed in other region.

Figure 8B:
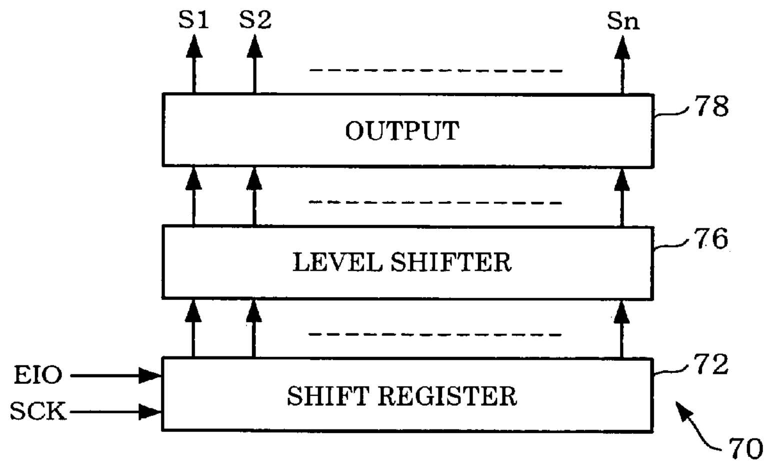
Figure 8C:
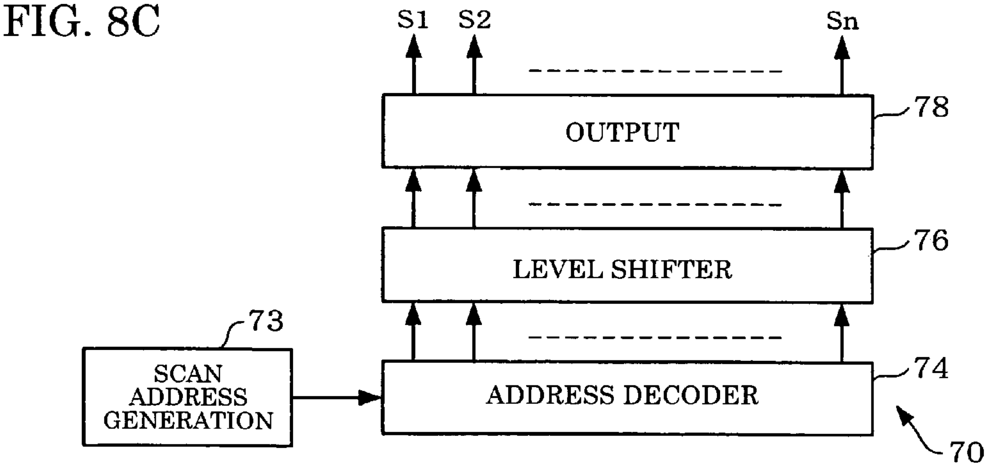

A scan driver 70 is a circuit for driving a scan line of the display panel. FIG. 8B shows a configuration example of the scan driver 70. A shift register 72 includes a plurality of sequentially connected flip-flops, and sequentially shifts an enable input-output signal EIO in synchronization with a shift clock signal SCK. A level shifter 76 converts the voltage level of the signal from the shift register 72 into a high voltage level for selecting the scan line. An output circuit 78 buffers a scan voltage converted and output by the level shifter 76, and outputs the scan voltage to the scan line of the display panel to drive the scan line. The scan driver 70 may be configured as shown in FIG. 8C. In FIG. 8C, a scan address generation circuit 73 generates and outputs a scan address, and an address decoder decodes the scan address. The scan voltage is output to the scan line specified by the decode processing through the level shifter 76 and the output circuit 78.

Figure 9A:
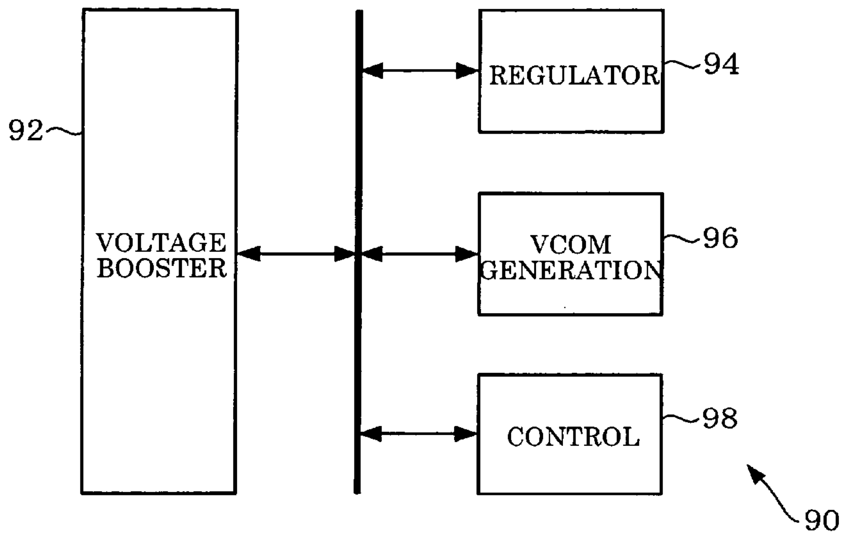
FIGS. 9A and 9B are configuration examples of a power supply circuit and a grayscale voltage generation circuit.

The power supply circuit 90 is a circuit which generates various power supply voltages. FIG. 9A shows a configuration example of the power supply circuit 90. A voltage booster circuit 92 is a circuit which generates a boosted voltage by boosting an input power source voltage or an internal power supply voltage by a charge-pump method using a boost capacitor and a boost transistor, and may include first to fourth voltage booster circuits and the like. A high voltage used by the scan driver 70 and the grayscale voltage generation circuit 110 can be generated by the voltage booster circuit 92. A regulator circuit 94 regulates the level of the boosted voltage generated by the voltage booster circuit 92. A VCOM generation circuit 96 generates and outputs a voltage VCOM supplied to a common electrode of the display panel. A control circuit 98 controls the power supply circuit 90, and includes various control registers and the like.

Figure 9B:
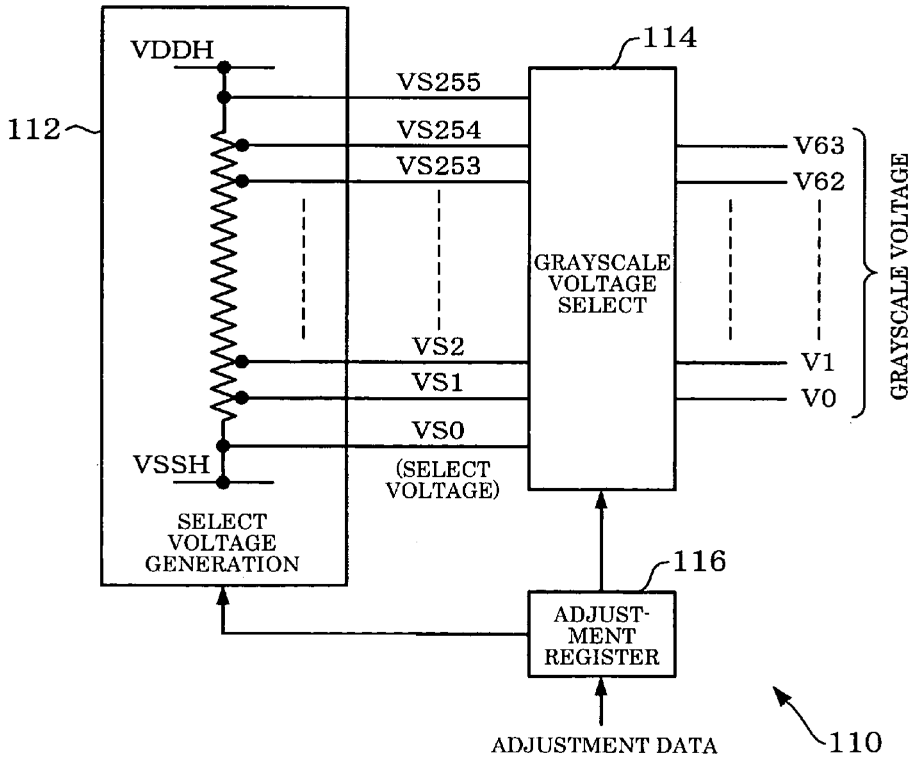

The grayscale voltage generation circuit 110 (γ-correction circuit) is a circuit which generates grayscale voltages. FIG. 9B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. A grayscale voltage select circuit 114 selects 64 (S in a broad sense; R>S) voltages from the select voltages VS0 to VS255 in the case of using 64 grayscales based on the grayscale characteristic adjustment data set in an adjustment register 116 by the logic circuit 40, and outputs the selected voltages as grayscale voltages V0 to V63. This enables generation of a grayscale voltage having grayscale characteristics (γ-correction characteristics) optimum for the display panel. In the case of performing a polarity reversal drive, a positive ladder resistor circuit and a negative ladder resistor circuit may be provided in the select voltage generation circuit 112. The resistance value of each resistor element of the ladder resistor circuit may be changed based on the adjustment data set in the adjustment register 116. An impedance conversion circuit (voltage-follower-connected operational amplifier) may be provided in the select voltage generation circuit 112 or the grayscale voltage select circuit 114.

Figure 10A:
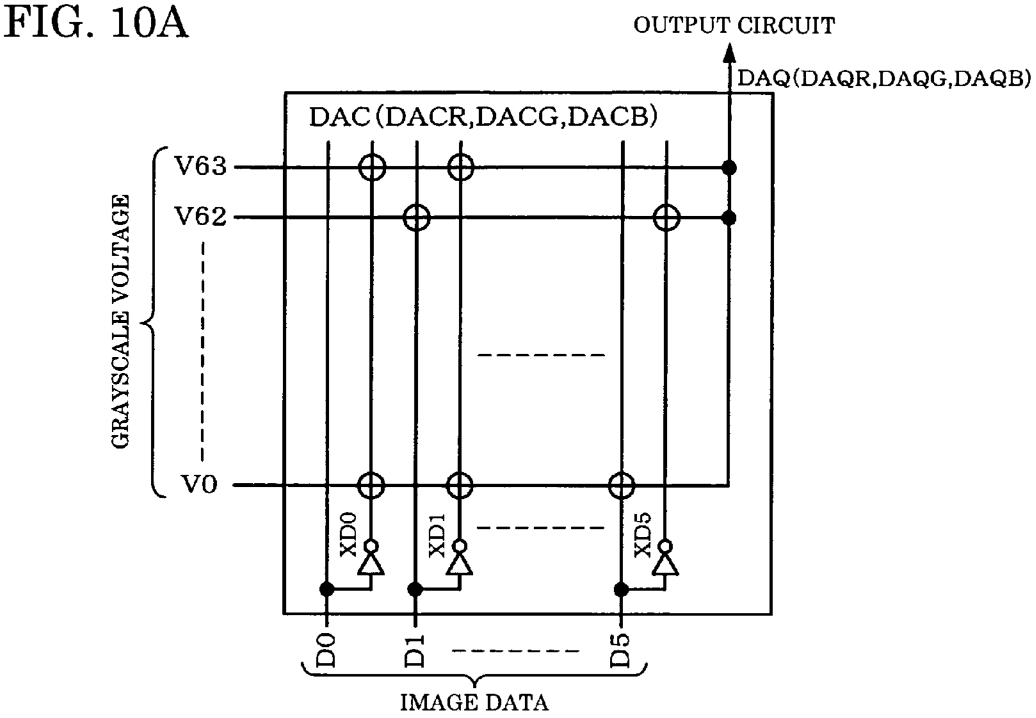
FIGS. 10A, 10B, and 10C are configuration examples of a D/A conversion circuit and an output circuit.

FIG. 10A shows a configuration example of a digital-analog converter (DAC) included in the D/A conversion circuit 54 shown in FIG. 8A. The DAC shown in FIG. 10A may be provided in subpixel units (or pixel units), and may be formed by a ROM decoder and the like. The DAC selects one of the grayscale voltages V0 to V63 from the grayscale voltage generation circuit 110 based on 6-bit digital image data D0 to D5 and inverted data XD0 to XD5 from the memory 20 to convert the image data D0 to D5 into an analog voltage. The DAC outputs the resulting analog voltage signal DAQ (DAQR, DAQG, DAQB) to the output circuit 56.

When R, G, and B data signals are multiplexed and supplied to a low-temperature polysilicon TFT display driver or the like (FIG. 10C), R, G, and B image data may be D/A converted by using one common DAC. In this case, the DAC shown in FIG. 10A is provided in pixel units.

Figure 10B:
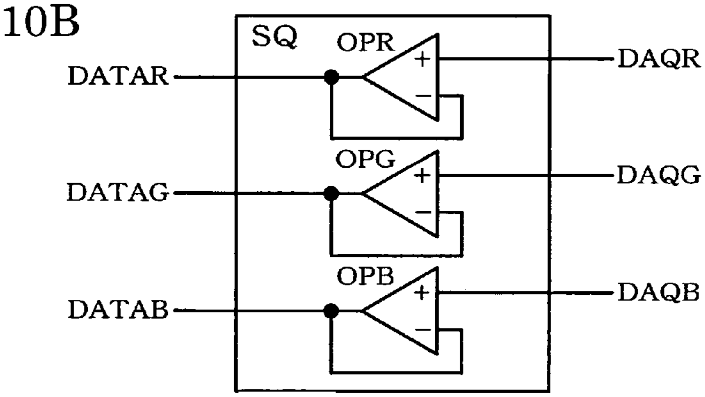
Figure 10C:
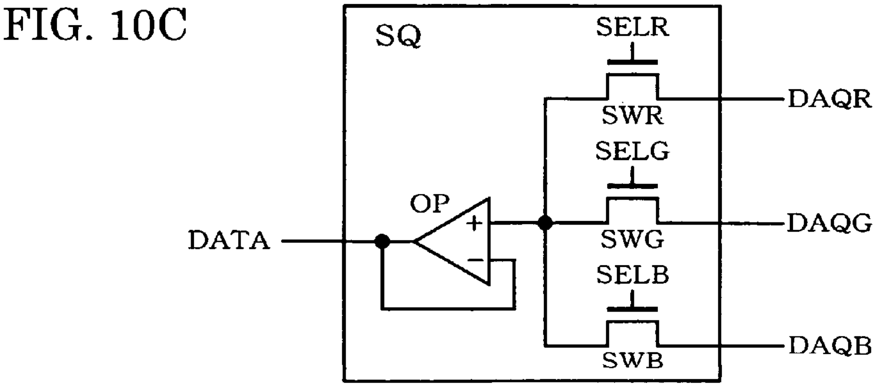

FIG. 10B shows a configuration example of an output section SQ included in the output circuit 56 shown in FIG. 8A. The output section SQ shown in FIG. 10B may be provided in pixel units. The output section SQ includes R (red), G (green), and B (blue) impedance conversion circuits OPR, OPC and OPB (voltage-follower-connected operational amplifiers), performs impedance conversion of the signals DAQR, DAQG and DAQB from the DAC, and outputs data signals DATAR, DATAG, and DATAB to R, G, and B data signal output lines. When using a low-temperature polysilicon TFT panel, switch elements (switch transistors) SWR, SWC, and SWB as shown in FIG. 10C may be provided, and the impedance conversion circuit OP may output a data signal DATA in which the R, G, and B data signals are multiplexed. The data signals may be multiplexed over a plurality of pixels. Only the switch elements and the like may be provided in the output section SQ without providing the impedance conversion circuit as shown in FIGS. 10B and 10C.

4. Arrangement of Element in Pad Arrangement Region

4.1 Arrangement of Control Transistor

In this embodiment, in order reduce the width of the integrated circuit device in the direction D2 to realize a narrow chip, elements which are generally disposed in the circuit block are disposed in the pad arrangement regions such as the output-side I/F region and the input-side I/F region. The data driver occupies a large area in the integrated circuit device. Therefore, the area of the integrated circuit device can be reduced by disposing the transistors of the data driver in the pad arrangement region.

On the other hand, the number of output lines of the data driver is generally very large. Therefore, when the transistors forming the operational amplifiers included in the data driver are disposed in the pad arrangement region, a number of signal lines must be provided in the pad arrangement region, whereby the area of the wiring region is increased. As a result, the width of the integrated circuit device in the direction D2 cannot be reduced.

In this embodiment, control transistors of the data driver controlled by using a control signal common to the data drivers are disposed in the pad arrangement region.

Figure 11:
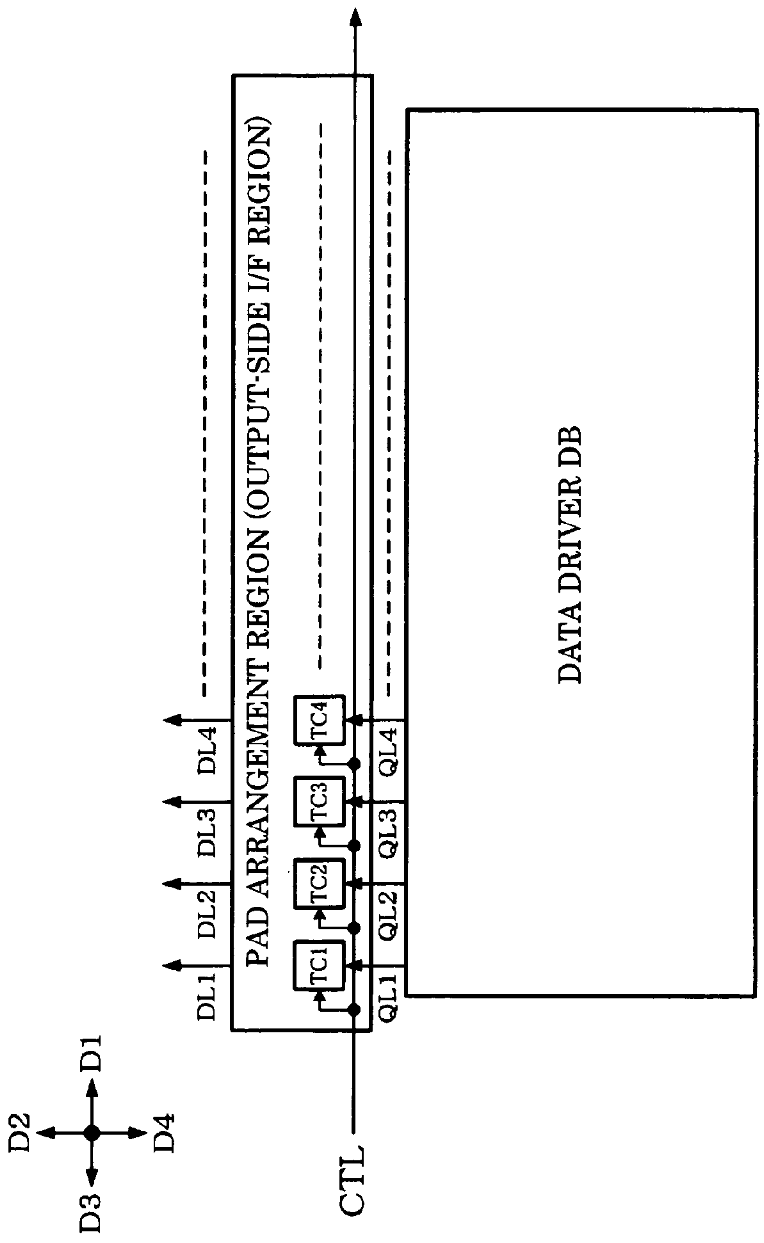
FIG. 11 is a view illustrative of a method of disposing control transistors according to one embodiment of the invention.

In FIG. 11, the integrated circuit device includes at least one data driver block DB for driving data lines DL1, DL2, DL3, DL4, . . . , for example. The integrated circuit device also includes a plurality of control transistors (potential setting transistors) TC1, TC2, TC3, TC4, . . . , and a pad arrangement region (output-side I/F region).

The control transistors TC1, TC2, TC3, TC4, . . . are respectively provided corresponding to output lines QL1, QL2, QL3, QL4, . . . of the data driver block DB, and controlled by using a common control signal CTL. The control transistor may be either an N-type (first conductivity type in a broad sense) transistor or a P-type (second conductivity type in a broad sense) transistor. Or, a circuit formed by combining an N-type transistor and a P-type transistor, such as a transfer gate transistor, may be used.

Data driver pads (pad metals) for electrically connecting the data lines of the display panel and the output line QL1, QL2, QL3, QL4, . . . of the data driver block DB are disposed in the pad arrangement region. A pad other than the data driver pad or a dummy pad may be disposed in the pad arrangement region. Or, an electrostatic protection element or a power supply protection circuit described later may be disposed in the pad arrangement region. The pad arrangement region is a region between the side (boundary or edge) of the circuit block and the side (e.g. second or fourth side) of the integrated circuit device, such as the output-side I/F region 12 or the input-side I/F region 14 shown in FIG. 3, for example. At least the center position (pad center) of the pad may be disposed in the pad arrangement region.

In this embodiment, the control transistors TC1, TC2, TC3, . . . are disposed in the pad arrangement region, as shown in FIG. 11. Specifically, transistors forming a differential section and a driver section of the operational amplifier of the data driver are not disposed in the pad arrangement region, but the control transistors TC1, TC2, TC3, . . . as shown in FIG. 11 are disposed in the pad arrangement region.

For example, an output transistor forming the driver section of the operational amplifier is controlled by inputting an input signal which differs for each data driver (subpixel driver cell) to its gate. Therefore, when such an output transistor is disposed in the pad arrangement region, the width of the integrated circuit device may be increased-in the direction D2 due to the input signal wiring region.

On the other hand, the control transistors TC1, TC2, TC3, TC4, . . . are controlled by using the common control signal CTL common to the data drivers (subpixel driver cells) instead of a signal which differs for each data driver. Therefore, the area of the wiring region is not increased to a large extent even if the control transistors TC1, TC2, TC3, TC4, . . . are disposed in the pad arrangement region, whereby the width of the integrated circuit device can be reduced in the direction D2.

Figure 12:
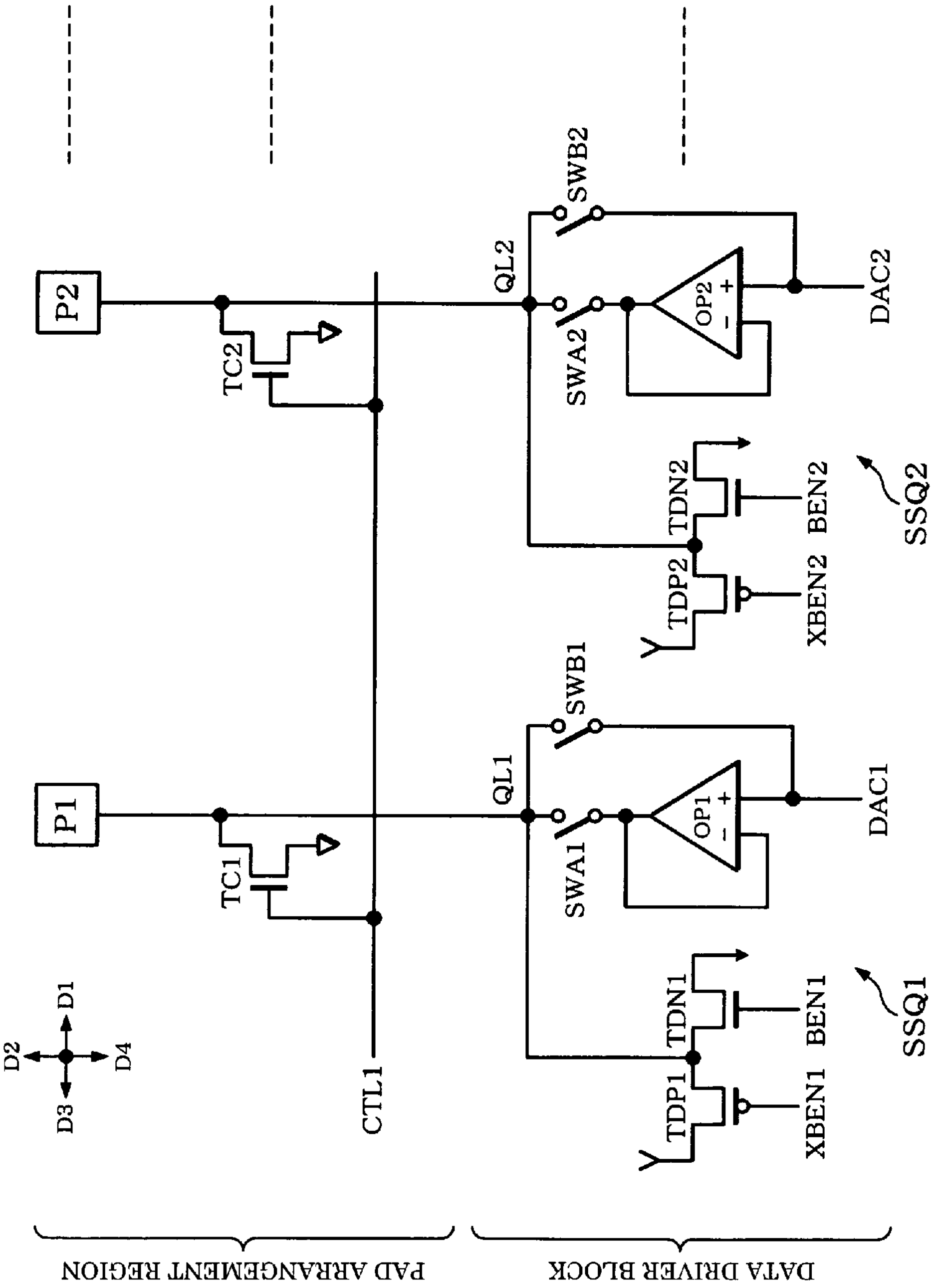
FIG. 12 is a configuration example of an output section of the data driver.

FIG. 12 shows a circuit configuration example of output sections SSQ1 and SSQ2 of the data driver (subpixel driver cell). The output section SSQ1 provided corresponding to a pad P1 includes an operational amplifier OP1, switch circuits SWA1 and SWB1, an N-type transistor TDN1, and a P-type transistor TDP1. The configuration of the output section SSQ2 is almost the same as that of the output section SSQ1. Therefore, detailed description of the output section SSQ2 is omitted.

The operational amplifier OP1 performs impedance conversion of the data signal output to the data line. Specifically, the operational amplifier OP1 performs impedance conversion of an output signal from a D/A converter DAC1 in the preceding stage and outputs the data signal to the data line to drive the data line.

The switch circuit SWA1 is inserted in series between the pad P1 connected with the output line QL1 of the output section SSQ1 and the operational amplifier OP1. The switch circuit SWB1 is inserted in series between the pad P1 and the input (output of the D/A converter DAC1) of the operational amplifier OP1. The switch circuits SWA1 and SWB1 may be formed using a transfer gate including an N-type transistor and a P-type transistor. The switch circuits SWA1 and SWB1 are ON/OFF controlled based on an enable signal from the logic circuit block. In more detail, the switch circuit SWA1 is turned ON (conducting state) and the switch circuit SWB1 is turned OFF (non-conducting state) in the first period of one horizontal scan period. This allows the data line to be driven by the operational amplifier OP1 in the first period. In the second period subsequent to the first period, the switch circuit SWA1 is turned OFF and the switch circuit SWB1 is turned ON, whereby the output from the D/A converter DAC1 is directly output to the data line as the data signal. The operating current of the operational amplifier OP1 is terminated or limited in the second period. This reduces the operation period of the operational amplifier OP1, whereby power consumption can be reduced.

The transistors TDN1 and TDP1 are eight-color display mode transistors. In the eight-color display mode, the gates of the transistors TDN1 and TDP1 are controlled using control signals BEN1 and XBEN1. In more detail, the gates of the transistors TDN1 and TDP1 are controlled using the control signals BEN1 and XBEN1 generated based on the most significant bit of image data. In the normal operation mode, the control signals BEN1 and XBEN1 are respectively set at the L level and the H level, whereby the drains of the transistors TDN1 and TDP1 are set in a high impedance state.

The control transistor TC1 is a discharge transistor. Specifically, the control transistor TC1 sets the output line QL1 of the output section SSQ1 (data driver block) at a potential VSS (ground potential) when the common control signal CTL1 (discharge signal) has become active to discharge an electric charge in the data line (display panel) connected with the pad P1 to the VSS side. The common control signal CTL1 (discharge signal) is input to the gate of the control transistor TC1, and the output line QL1 of the output section SSQ1 (data driver block) is connected with the drain of the control transistor TC1.

The discharge control signal CTL1 may be generated based on an initialization signal (reset signal) and a detection signal from a voltage level drop detection circuit included in the data driver. Specifically, the control signal CTL1 becomes active when a high-potential-side power supply voltage has decreased to a voltage equal to or less than a given threshold voltage or when the initialization signal has become active. This allows an electric charge stored in the data line connected with the pad P1 to be discharged. This prevents a situation in which image persistence occurs in the display panel due to residual electric charge in the data line when an unexpected decrease in the power supply voltage occurs due to initialization or removal of a built-in battery.

In this embodiment, the control transistors TC1 and TC2 as shown in FIG. 12 are disposed in the pad arrangement region. In more detail, the control transistors TC1 and TC2 are disposed in the lower layer of (under) the pads P1 and P2 so that the control transistors TC1 and TC2 at least partially (partially or entirely) overlap the pads P1 and P2 (pad metals) when viewed from the top side. In other words, the pads P1 and P2 (data driver pads) are disposed in the upper layer of the control transistors TC1 and TC2 so that the pads P1 and P2 overlap part or the entirety of the control transistors TC1 and TC2 when viewed from the top side.

When a transistor is disposed in the lower layer of a pad, the threshold voltage of the transistor may change due to stress applied when bonding a bonding wire or mounting using a bump. Moreover, the capacitance of an interlayer dielectric of the transistor may change from the designed capacitance. Therefore, the characteristics of the transistor on a wafer may change after mounting. Therefore, transistors for outputting an analog voltage, such as transistors (analog circuits) forming the differential sections (differential stage) and the driver sections (driver stage) of the operational amplifiers OP1 and OP2, are disposed in the data driver block instead of disposing the transistors in the lower layer of the pads.

On the other hand, transistors which function as digital switches and output a digital voltage, such as the control transistors TC1 and TC2, are disposed in the lower layer of the pads. This prevents the above problem and reduces the layout area of the integrated circuit device, whereby the width of the integrated circuit device in the direction D2 can be further reduced. For example, since the number of output lines of the data driver is very large, a significant area reduction effect can be obtained.

The gates of the output transistors forming the driver sections of the operational amplifiers OP1 and OP2 are controlled using gate control signals which differ between the output sections SSQ1 and SSQ2. Therefore, when disposing these output transistors in the pad arrangement region, it is necessary to provide gate control signal lines in the same number as the data lines in the pad arrangement region, whereby the area of the wiring region is increased.

On the other hand, the control transistors TC1 and TC2 shown in FIG. 12 are controlled using the common control signal CTL1. Therefore, it suffices to provide a common control signal line in the pad arrangement region when disposing the control transistors TC1 and TC2 in the pad arrangement region. Moreover, since the output lines QL1 and QL2 are connected with the pads P1 and P2 through connection lines, the area of the wiring region is increased to only a small extent by disposing the control transistors TC1 and TC2 under the connection lines and connecting the drains of the control transistors TC1 and TC2 with the connection lines. Therefore, an increase in the area of the wiring region due to arrangement of the control transistors TC1 and TC2 is minimum.

Figure 13:
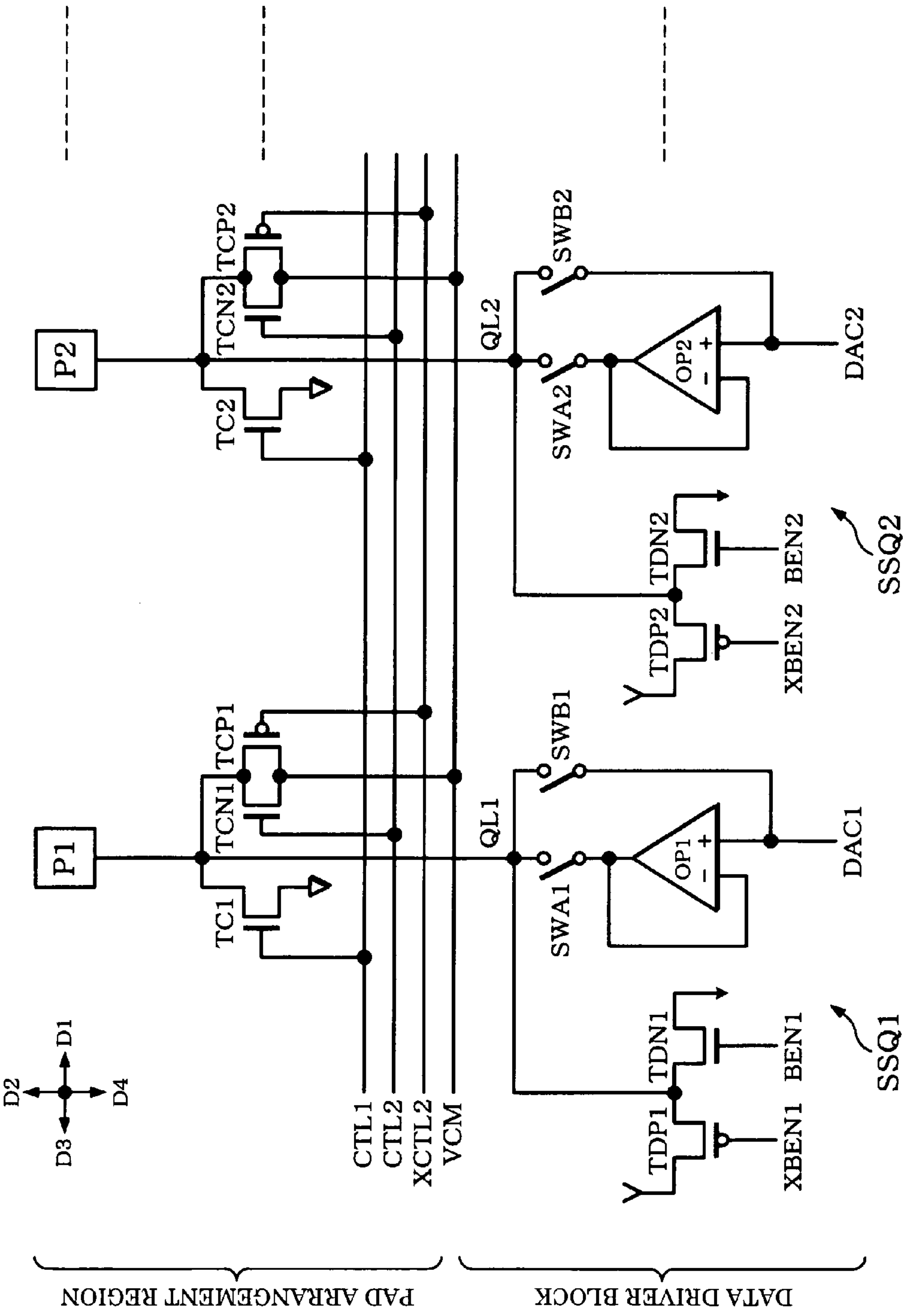
FIG. 13 is a configuration example of the output section of the data driver.

In FIG. 13, an N-type control transistor TCN1 and a P-type control transistor TCP1 forming a transfer gate are provided corresponding to the pad P1. An N-type transistor TCN2 and a P-type transistor TCP2 forming a transfer gate are provided corresponding to the pad P2. The drains of the transistors TCN1 and TCP1 and the drains of the transistors TCN2 and TCP2 are respectively connected with the output lines QL1 and QL2. A given common potential VCM is supplied to the sources of the transistors TCN1 and TCP1 and the sources of the transistors TCN2 and TCP2. The common potential VCM is the common potential supplied to the common electrode of the display panel, for example. Or, the common potential VCM is the potential at one end of a capacitor connected with an external terminal of the integrated circuit device. Therefore, when common control signals CTL2 and XCTL2 have become active, the output lines QL1 and QL2 of the data driver block are set at the common potential VCM.

In this embodiment, the control transistors TCN1, TCP1, TCN2, and TCP2 are also disposed in the pad arrangement region. In more detail, the control transistors TCN1, TCP1, TCN2, and TCP2 are disposed in the lower layer of (under) the pads P1 and P2 (pad metals) so that the control transistors TCN1, TCP1, TCN2, and TCP2 at least partially overlap the pads P1 and P2. Note that some of the control transistors TC1, TC2, TCN1, TCP1, TCN2, and TCP2 may not be disposed in the lower layer of the pads. Or, a modification may be made in which other transistors of the output sections SSQ1 and SSQ2 are disposed in the pad arrangement region.

Figure 14:
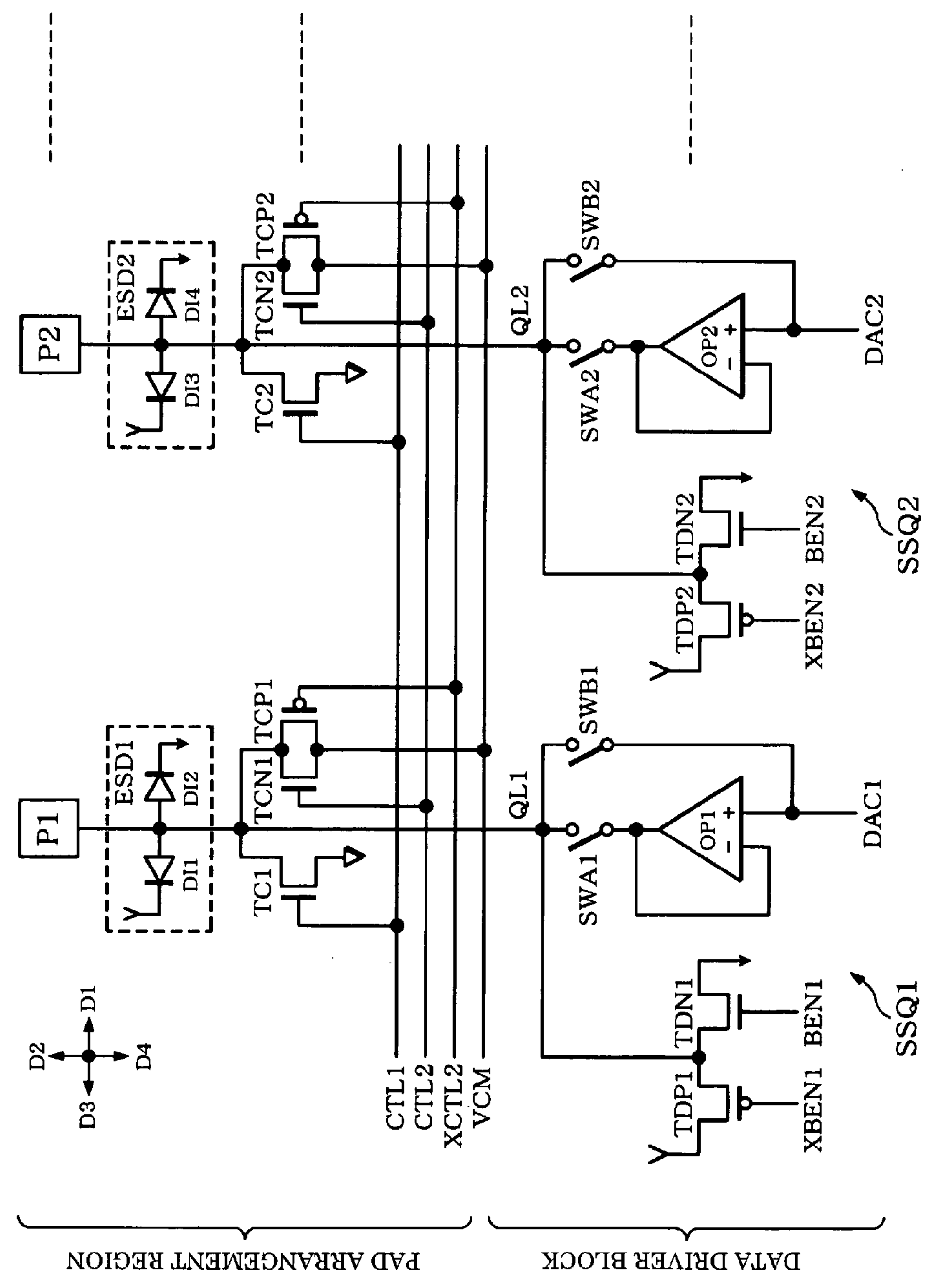
FIG. 14 is a configuration example of the output section of the data driver.

In FIG. 14, a first electrostatic protection element ESD1 is provided corresponding to the pad P1, and a second electrostatic protection element ESD2 is provided corresponding to the pad P2. The first electrostatic protection element ESD1 includes a first diode DI1 provided between a high-potential-side power supply (VDD2) and the output line QL1 of the data driver block, and a second diode DI2 provided between a low-potential-side power supply (VSS) and the output line QL1. The second electrostatic protection element ESD2 includes a third diode DI3 provided between the high-potential-side power supply and the output line QL2 of the data driver block, and a fourth diode DI4 provided between the low-potential-side power supply and the output line QL2. The diodes DI1 to DI4 may be Zener diodes formed at the boundary between a diffusion region and a well region or the like, or may be GCD transistor diodes formed by connecting the source and the gate of the transistor.

In this embodiment, the electrostatic protection elements ESD1 and ESD2 are also disposed in the pad arrangement region. In more detail, the electrostatic protection elements ESD1 and ESD2 are disposed in the lower layer of the pads P1 and P2 so that the electrostatic protection elements ESD1 and ESD2 at least partially overlap the pads P1 and P2. This further reduces the width of the integrated circuit device in the direction D2.

4.2 Layout of Pad Arrangement Region

Figure 15:
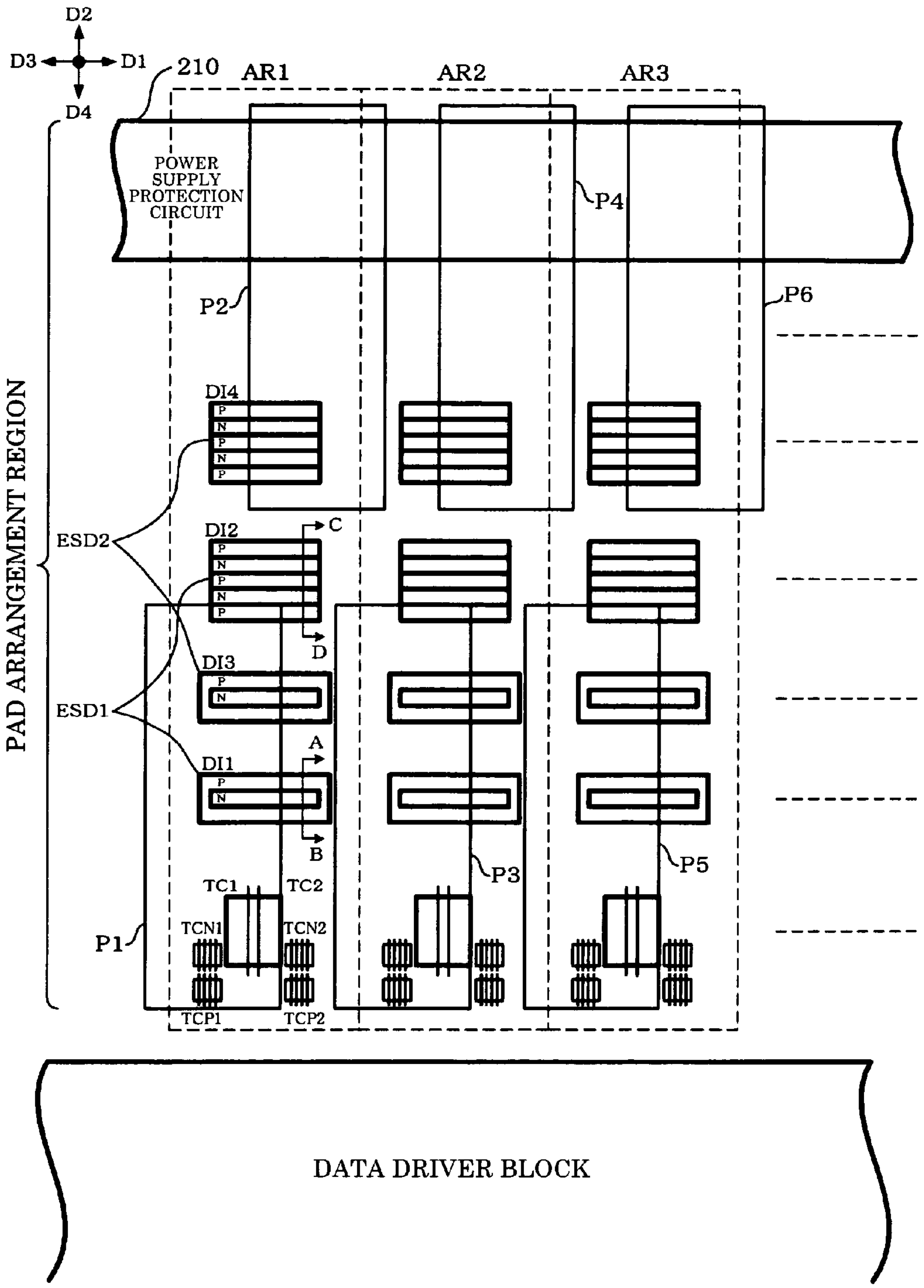
FIG. 15 is a layout example of a pad arrangement region.
Figure 16A:
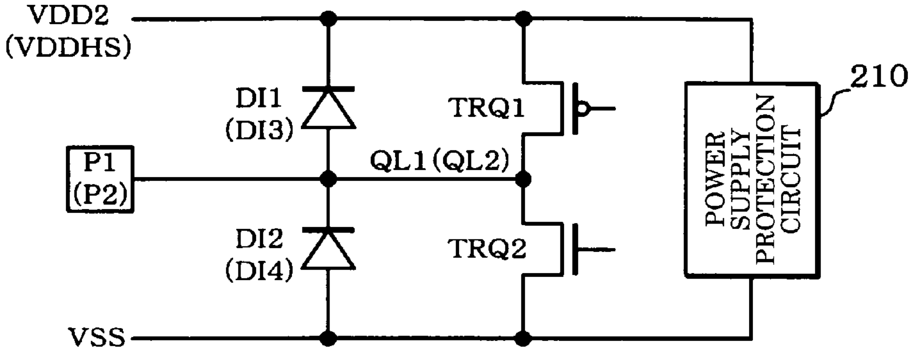
FIGS. 16A and 16B are views illustrative of connection between an electrostatic protection element and a pad.

FIG. 15 shows a layout example of the pad arrangement region. FIG. 16A shows an example of an electrostatic protection element and the like provided between the power supplies VDD2 (VDDHS) and VSS. In FIG. 16A, the diode DI1 (DI3) is provided between the output line QL1 (QL2) connected with the pad P1 (P2) and the power supply VDD2. The diode DI2 (DI4) is provided between the output line QL1 (QL2) and the power supply VSS. An electric charge can be discharged to the power supply VDD2 or VSS when an electrostatic voltage is applied to the pad P1 by providing the diodes DI1 and DI2, whereby the transistors TRQ1 and TRQ2 (e.g. the output transistor of the driver section of the operational amplifier) can be protected against static electricity.

In FIG. 16A, a power supply protection circuit 210 is provided between the high-potential-side power supply VDD2 and the low-potential-side power supply VSS. The power supply protection circuit 210 functions as a voltage clamp circuit which clamps the voltage at a specific voltage when a voltage equal to or higher than a given voltage is applied between the power supplies VDD2 and VSS. As the power supply protection circuit 210, a silicon controlled rectifier (SCR), a bipolar transistor, or diodes connected in series and opposite directions may be used.

Figure 16B:
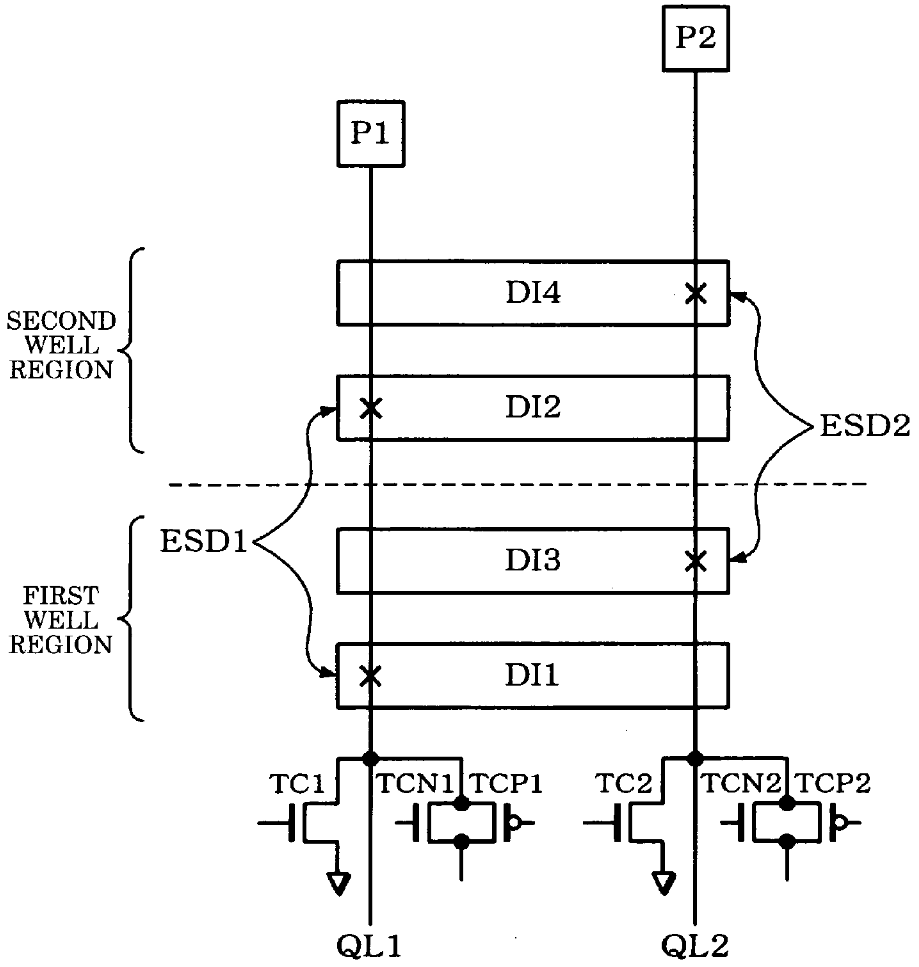

FIG. 16B shows the connection relationship among the pads P1 and P2, the diodes DI1 to DI4 of the electrostatic protection elements ESD1 and ESD2, and the control transistors TC1, TC2, TCN1, TCP1, TCN2, and TCP2 shown in FIG. 15. As shown in FIG. 16B, the diodes DI1 and D12 of the electrostatic protection element ESD1 and the control transistors TC1, TCN1, and TCP1 are connected with pad P1. The diodes DI3 and DI4 of the electrostatic protection element ESD2 and the control transistors TC2, TCN2, and TCP2 are connected with pad P2. The diodes DI1 and DI3 are formed in a first well region, and the diodes DI2 and DI4 are formed in a second well region isolated from the first well region.

In FIG. 15, the direction in which the data lines of the display panel (output line) are arranged is the direction D1, and the direction perpendicular to the direction D1 is the direction D2. As shown in FIG. 15, the control transistors TC1, TC2, TCN1, TCP1, TCN2, and TCP2 (TC1 to TCP2) described with reference to FIG. 14 are disposed on the D2 side of the data driver block. The electrostatic protection elements ESD1 (diodes DI1 and DI2) and ESD2 (diodes DI3 and DI4) are disposed on the D2 side of the control transistors TC1 to TCP2. Specifically, the control transistors TC1 to TCP2 are disposed between the data driver block and the electrostatic protection elements ESD1 and ESD2. In FIG. 15, the control transistors TC1 to TCP2 and the electrostatic protection elements ESD1 and ESD2 are disposed in the lower layer of (under) the pads P1 and P2 so that the control transistors TC1 to TCP2 and the electrostatic protection elements ESD1 and ESD2 partially overlap the pads P1 and P2 when viewed from the top side.

According to this arrangement, since the control transistors TC1 to TCP2 are disposed immediately close to the data driver block, the output lines from the data driver block can be connected with the control transistors TC1 to TCP2 along a short path, whereby the layout efficiency and wiring efficiency can be increased. According to this arrangement, the electrostatic protection elements ESD1 and ESD2 are disposed close to the pads P1 and P2 in comparison with the control transistors TC1 to TCP2. Therefore, when a electrostatic voltage is applied to the pads P1 and P2, static electricity is discharged by the electrostatic protection elements ESD1 and ESD2 and applied to the control transistors TC1 to TCP2 after a time delay. This prevents a situation in which the control transistors TC1 to TCP2 are destroyed due to static electricity.

In this case, the electrostatic withstand voltage may be increased by increasing the drain area of the control transistors TC1 to TCP2. However, this method increases the width of the pad arrangement region in the direction D2, whereby the width of the integrated circuit device is increased in the direction D2.

According to the arrangement shown in FIG. 15, since the electrostatic withstand voltage can be increased without increasing the drain area of the control transistors TC1 to TCP2 to a large extent, whereby the width of the integrated circuit device can be reduced in the direction D2.

In FIG. 15, the pad arrangement region includes a plurality of arrangement areas AR1, AR2, AR3 . . . arranged along the direction D1. Two (K in a broad sense; K is an integer of two or more) data driver pads P1 and P2 (pad center position) arranged along the direction D2 are disposed in the arrangement area AR1 (each arrangement area). Two (K) electrostatic protection elements ESD1 and ESD2 respectively connected with the pads P1 and P2 are also disposed in the arrangement area AR1. The control transistors TC1 to TCP2 are also disposed in the arrangement area AR1.

In FIG. 15, two pads are disposed in each arrangement area in a staggered arrangement. For example, the pads P1 and P2 arranged along the direction D2 are disposed so that the center positions are displaced (staggered) from each other in the direction D1. Specifically, when the direction D1 is the X axis, the pads P1 and P2 differ in the X coordinate.

A large number of pads can be disposed along the direction D1 by disposing the pads P1 and P2 in a staggered arrangement, whereby a large number of data signals from the data driver block can be output to the data lines through the pads.

When the pad pitch is decreased by disposing the pads in a staggered arrangement, the width of the arrangement area AR1 is decreased in the direction D1. In FIG. 15, the arrangement area AR1 is formed using a pair of pads P1 and P2. Therefore, the width of the arrangement area AR1 in the direction D1 can be secured to a certain extent. Therefore, the electrostatic protection elements ESD1 and ESD2 and the control transistors TC1 to TCP2 can be disposed in the arrangement area AR1.

In FIG. 15, the first electrostatic protection element ESD1 which is one of the two (K) electrostatic protection elements disposed in the arrangement area AR1 includes the first and second diodes DI1 and DI2, and the second electrostatic protection element ESD2 includes the third and fourth diodes DI3 and DI4. The diodes DI1, DI2, DI3, and DI4 are disposed in the arrangement area AR1 along the direction D2. The width of the arrangement area AR1 can be reduced in the direction D1 by stacking the diodes DI1 to DI4 along the direction D2.

Specifically, as a method of a comparative example, the diodes DI1 and DI2 may be stacked along the direction D1, and the diodes DI3 and DI4 may be stacked along the direction D1 on the upper side of the diodes DI1 and DI2. However, this method increases the width of the arrangement area AR1 in the direction D1, since the diodes are stacked along the direction D1 and the P-type well region and the N-type well region are arranged along the direction D1.

In FIG. 15, the diodes DI1 to DI4 are stacked along the direction D2, and the P-type well region and the N-type well region are arranged along the direction D2. Specifically, the first well region (N-type) in which the diodes DI1 and DI3 are formed and the second well region (P-type) in which the diodes DI2 and DI4 are separated in the direction D2. Therefore, the width of the arrangement area AR1 can be reduced in the direction D1, thereby making it possible to deal with a narrow pad pitch.

Figure 17A:
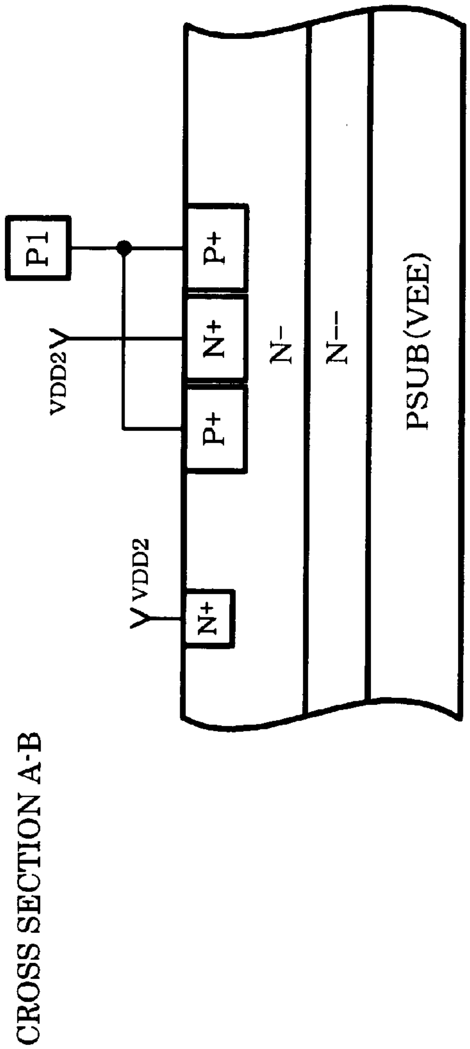
FIGS. 17A and 17B are cross-sectional views of diodes.

FIG. 17A schematically shows the cross section of the diode DI1 shown in FIG. 15 along the line A-B. As shown in FIG. 17A, the diode DI1 is formed at the junction surface between a P+ diffusion region connected with the pad P1 and an N+ diffusion region or N-type well connected with the power supply VDD2 (MV power supply).

Figure 17B:
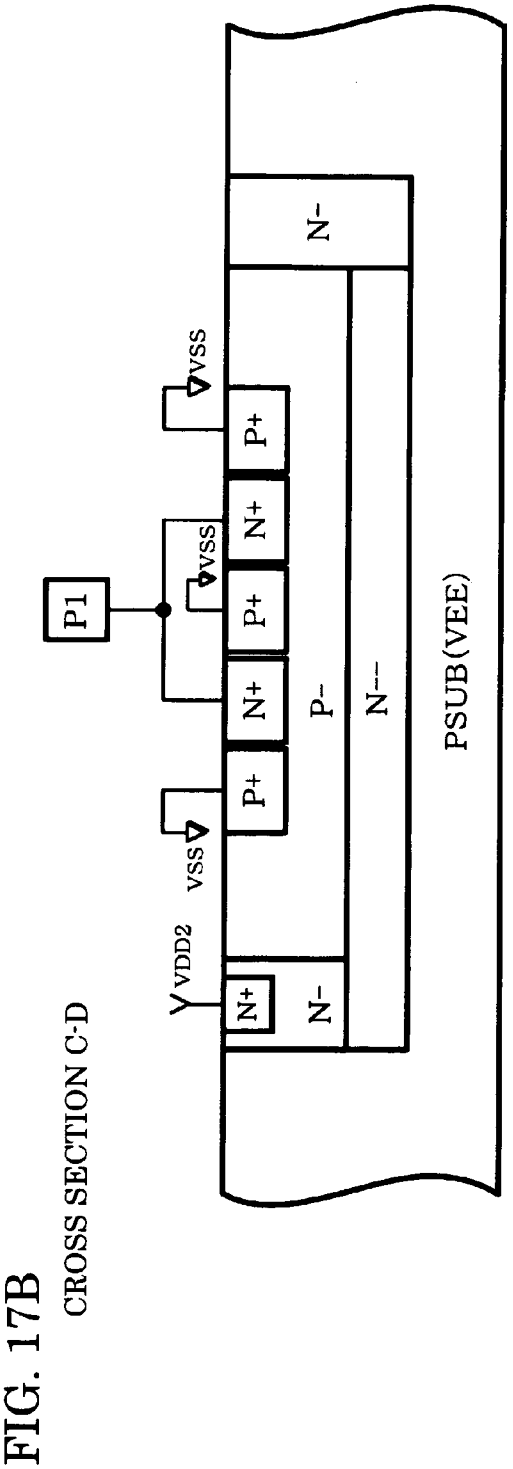

FIG. 17B schematically shows the cross section of the diode DI2 shown in FIG. 15 along the line C-D. As shown in FIG. 17B, the diode DI2 is formed at the junction surface between a P+ diffusion region or P-type well connected with the power supply VSS and an N+ diffusion region connected with the pad P1. As shown in FIGS. 17A and 17B, a substrate PSUB is connected with a negative high-potential power supply (VEE). A low-concentration N-type well (deep well) is formed on the substrate PSUB, and a high-concentration N-type well or P-type well is formed on the low-concentration N-type well.

As shown in FIG. 15, the diodes DI1 to DI4 have diffusion regions (P+ and N+) of which the long side extends along the direction D1 and the short side extends along the direction D2. The wiring impedance can be reduced by forming the diffusion regions of the diodes DI1 to DI4 in a narrow shape so that the long side direction coincides with the direction D1. Specifically, the wiring impedance can be reduced by connecting the electrostatic protection elements ESD1 and ESD2 and the pads P1 and P2 using thick aluminum wires. In order to connect the electrostatic protection elements ESD1 and ESD2 and the pads P1 and P2 using thick aluminum wires, it is suitable to form the diffusion regions of the diodes DI1 to DI4 in a narrow shape.

In FIG. 15, the power supply protection circuit 210 provided between the high-potential-side power supply and the low-potential-side power supply is disposed on the side of the electrostatic protection elements ESD1 and ESD2 in the direction D2. Specifically, since the power supply protection circuit 210 must immediately clamp the voltage to protect the transistors in the circuit block when a high voltage is applied, the circuit scale of the power supply protection circuit 210 is generally large. On the other hand, it is necessary to provide the power supply protection circuit 210 corresponding to each output pad of the data driver, differing from the electrostatic protection elements ESD1 and ESD2.

In FIG. 15, the power supply protection circuit 210 is formed along the edge of the integrated circuit device on the side of the electrostatic protection elements ESD1 and ESD2 in the direction D2. This allows a plurality of power supply protection circuits 210, each of which is disposed in units of a plurality of pads, to be formed by effectively utilizing the region in the lower layer of the pads. Therefore, the electrostatic withstand voltage can be increased while minimizing an increase in the area of the integrated circuit device.

4.3 Driver Macrocell

Figure 18A:
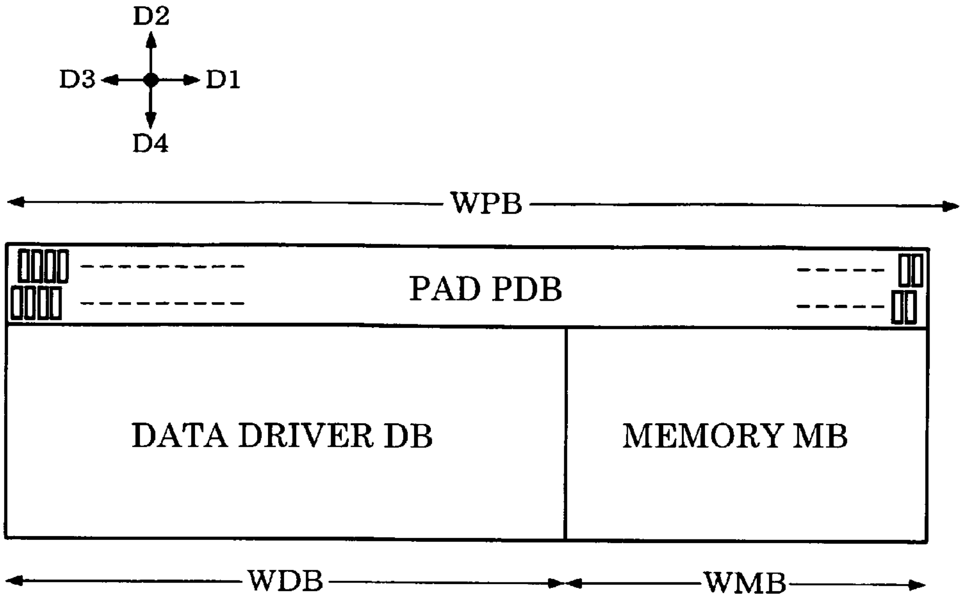
FIGS. 18A and 18B are views illustrative of a macrocell integration method according to one embodiment of the invention.

The integrated circuit device according to this embodiment includes at least one driver macrocell (driver macroblock) in which a plurality of circuit blocks are integrated into a macrocell (macro or macroblock), as shown in FIG. 18A. The driver macrocell is a hard macro in which routing (wiring) and circuit cell placement (arrangement) are fixed, for example. In more detail, routing and circuit cell placement of the driver macrocell are carried out by a manual layout. Note that part of routing and placement may be automated.

The driver macrocell shown in FIG. 18A includes a data driver block DB for driving data lines (source lines) and a memory block MB which stores image data. The driver macrocell also includes a pad block PDB in which pads for electrically connecting output lines of the data driver block DB with data lines of a display panel are disposed. The pad block PDB includes two rows (a plurality of rows in a broad sense) of pads disposed in a staggered arrangement in the direction D2. The pads (pad metals) are arranged in each row along the direction D1. The above-described control transistors, electrostatic protection elements, power supply protection circuit, and the like may be disposed in the pad block PDB.

In FIG. 18A, the data driver block DB and the memory block MB are disposed along the direction D1, and the pad block PDB is disposed on the D2 side of the data driver block DB and the memory block MB. In more detail, the data driver block DB is adjacent to the memory block MB along the direction D1, and the data driver block DB and the memory block MB are adjacent to the pad block PDB along the direction D2. A modification is also possible in which another circuit is provided between the data driver block DB and the memory block MB, or the memory block MB is omitted from the driver macrocell.

In general, the number of pads connected with the output lines of the data driver is very large. When connecting the output lines of the data driver with the data driver pads using an automatic routing tool, the width of the integrated circuit device in the direction D2 is increased due to an increase in the area of the output line wiring region. This makes it difficult to realize a narrow chip.

In FIG. 18A, the data driver block DB and the pad block PDB are integrated into a macrocell. Therefore, a completed macrocell formed by efficiently manually routing the output lines of the data driver to the pads can be registered and used as a driver macrocell, for example. Therefore, the output line wiring region can be reduced in comparison with a method of routing the output lines of the data driver using an automatic routing tool. As a result, the width of the integrated circuit device in the direction D2 can be reduced, whereby a narrow chip can be realized.

Moreover, macrocell integration as shown in FIG. 18A allows an integrated circuit device having a layout as shown in FIGS. 5A and 5B to be realized by merely disposing the driver macrocells along the direction D1, whereby the efficiency of circuit design and layout work can be improved. For example, a change in the number of pixels of the display panel can be dealt with by merely changing the number of driver macrocells to be disposed. This makes it unnecessary to reroute the output lines of the data driver, whereby the working efficiency can be improved.

In FIG. 18A, the region on the D2 side of the memory block MB can be effectively used as the pad arrangement region in addition to the region on the D2 side of the data driver block DB. Specifically, the pads can be disposed in the region on the D2 side of the memory block MB. Therefore, the pads can be efficiently disposed in the pad block PDB with a width of WPB, whereby the layout efficiency can be improved.

In the comparative example shown in FIG. 1A, since the memory block MB and the data driver block DB are disposed along the direction D2 (short side direction) corresponding to the signal flow, it is difficult to realize a narrow chip. When the memory block MB or the data driver block DB is changed in the width in the direction D2 or the length in the direction D1 due to a change in the number of pixels of the display panel, the specification of the display driver, the configuration of the memory cell, or the like, the remaining circuit blocks are affected by such a change, whereby the design efficiency is decreased.

In FIG. 18A, since the data driver block DB and the memory block MB are adjacently disposed along the direction D1, the width of the integrated circuit device in the direction D2 can be reduced. Moreover, design efficiency can be increased.

In the comparative example shown in FIG. 1A, since the wordline WL is disposed along the direction D1 (long side direction), a significant signal delay occurs in the wordline WL, whereby the read speed of image data is decreased. In particular, since the wordline WL connected with the memory cell is formed using a polysilicon layer, such a signal delay poses a serious problem.

In FIG. 18A, the wordline WL can be disposed along the direction D2 (short side direction) and the bitline BL can be disposed along the direction D1 (long side direction) in the memory block MB. In this embodiment, the integrated circuit device has a small width W in the direction D2. Therefore, the length of the wordline WL in the memory block MB can be reduced, whereby a signal delay occurring in the wordline WL can be reduced. In the comparative example shown in FIG. 1A, since the wordline WL, which is long in the direction D1 and has a large parasitic capacitance, is selected even when only the access region of the memory is accessed from the host, power consumption is increased. In FIG. 18A, since only the wordline WL provided in the memory block corresponding to the access region is selected during the host access, power consumption can be reduced.

4.4 Width of Driver Macrocell

Figure 18B:
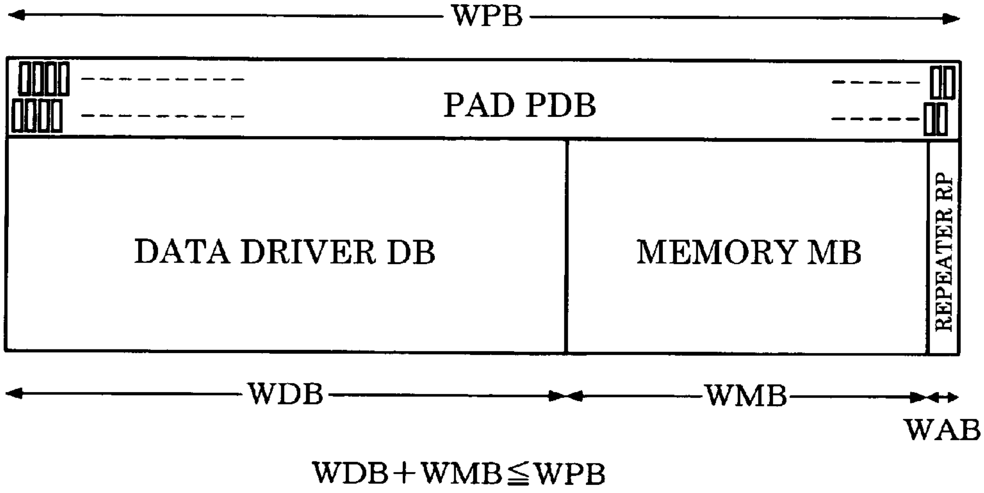

In FIGS. 18A and 18B, when the widths of the data driver block DB, the memory block MB, and the pad block PDB in the direction D1 are respectively WDB, WMB, and WPB, the relationship "WDB+WMB≤WPB" may be satisfied.

In FIG. 18A, the width WPB of the pad block PDB in the direction D1 is almost equal to the sum of the width WDB of the data driver block DB and the width WMB of the memory block MB. Therefore, "WDB+WMB=WPB" is satisfied, for example. In FIG. 18B, a repeater block RP is disposed as an additional circuit. The repeater block RP is a circuit block including a buffer which buffers at least a write data signal (or, address signal or memory control signal) supplied to the memory block MB and outputs the write data signal to the memory block MB. In FIG. 18B, "WDB+WMB<WPB" is satisfied.

If the relationship "WDB+WMB≤WPB" is satisfied, when arranging the driver macrocells along the direction D1, the pad blocks are arranged along the direction D1 without an unnecessary space being formed between the adjacent pad blocks. Therefore, the data driver pads are efficiently arranged along the direction D1, whereby the width of the integrated circuit device in the direction D1 can be reduced.

If the relationship "WDB+WMB≤WPB" is satisfied, the repeater block RP (additional circuit) as shown in FIG. 18B can be disposed, whereby the layout efficiency can be increased. Specifically, when a space is formed adjacent to the memory block MB or the data driver block DB due to an increase in the width WPB of the pad block PDB resulting from the limitations to the pad pitch, an additional circuit can be disposed in the space. The additional circuit disposed in such a space is not limited to the repeater block RP. For example, part of the grayscale voltage generation circuit, a circuit which sets the output line of the data driver at a specific potential, an electrostatic protection circuit, or the like may be disposed as the additional circuit.

Figure 19A:
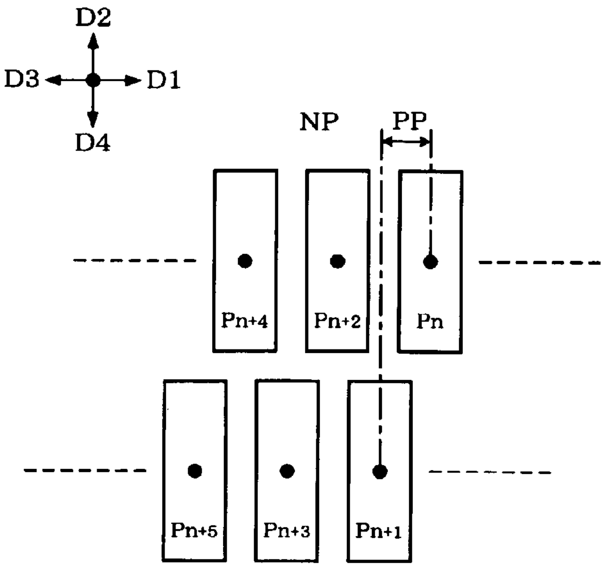
FIGS. 19A and 19B are other views illustrative of the macrocell integration method according to one embodiment of the invention.

FIG. 19A shows a pad (pad metal) arrangement example in the pad block PDB. In FIG. 19A, the first row of pads arranged in the direction D1 and the second row of pads arranged in the direction D1 are stacked in the direction D2 in a staggered arrangement. Specifically, when the direction D1 is defined as the X axis and the direction D2 is defined as the Y axis, the pads are disposed so that the X coordinate of the center of the pad in the first row does not coincide with the X coordinate of the center of the pad in the second row. In FIG. 19A, the difference between the X coordinates of the centers of the pads is referred to as a pad pitch PP in the direction D1. For example, the difference between the X coordinates of the centers of the pads Pn and Pn+1 is the pad pitch PP (e.g. 20 to 22 μm).

Figure 19B:
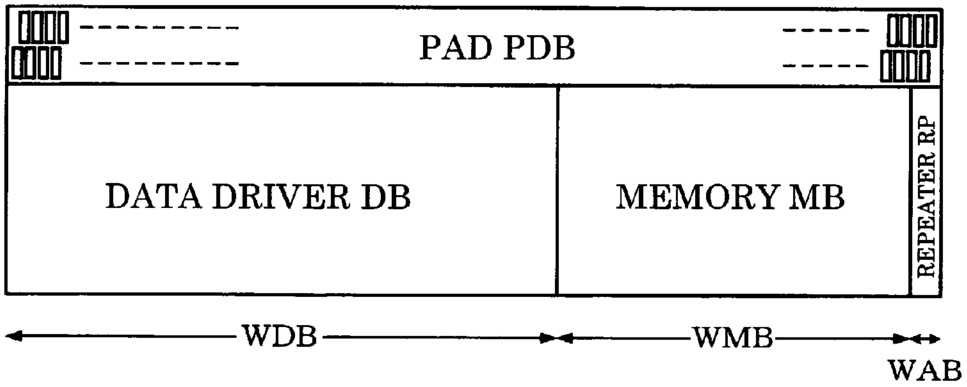

In FIG. 19B, the width of the repeater block RP (additional circuit block) in the direction D1 is WAB, and the number of pads in the pad block PDB is NP. In this case, the relationship "(NP−1)×PP<WDB+WMB+WAB<(NP+1)×PP" is satisfied, for example.

If this relationship is satisfied, when arranging the driver macrocells along the direction D1, the pad blocks are arranged along the direction D1 so that an unnecessary space is not formed, whereby the pads can be arranged along the direction D1 at a uniform pad pitch. When the pads are arranged at a uniform pad pitch, stress uniformly occurs in the pad arrangement region when mounting the integrated circuit device on a glass substrate using bumps or the like, whereby connection failure can be prevented. When a space exists between the pads, the flow of an adhesive such as an anisotropic conductive material (e.g. ACF) may change due to the space, whereby connection failure or the like may occur. On the other hand, such a problem can be prevented by arranging the pads at a uniform pad pitch. The relationship "WDB+WMB+WAB≤NP×PP" may be satisfied. In this case, the pad pitch in the direction D1 can be made more uniform, whereby the stress can be further equalized.

When an additional circuit such as the repeater block RP is not disposed, the width WAB may be set at zero. A dummy pad (e.g. pad which is not connected with the bump or bonding wire) other than the data driver pad may be disposed in the pad block PDB. In this case, the number of pads NP may be the sum of the number of data driver pads and the number of dummy pads.

5. Details of Data Driver Block and Memory Block

5.1 Block Division

Figure 20A:
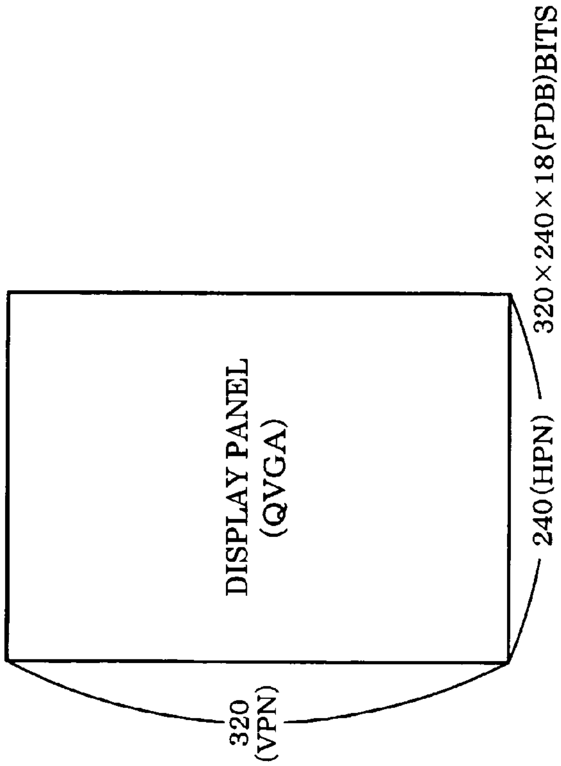
FIGS. 20A and 20B are views illustrative of a memory/data driver block division method.

Consider the case where the display panel is a QVGA panel in which the number of pixels VPN in the vertical scan direction (data line direction) is 320 and the number of pixels HPN in the horizontal scan direction (scan line direction) is 240, as shown in FIG. 20A. Suppose that the number of bits PDB of image (display) data of one pixel is 18 bits (six bits each for R, G, and B). In this case, the number of bits of image data required to display one frame on the display panel is "VPN×HPN×PDB=320×240×18" bits. Therefore, the memory of the integrated circuit device stores at least "320×240×18" bits of image data. The data driver outputs data signals for 240 (=HPN) data lines (data signals corresponding to "240×18" bits of image data) to the display panel in units of horizontal scan periods (in units of periods in which one scan line is scanned).

Figure 20B:
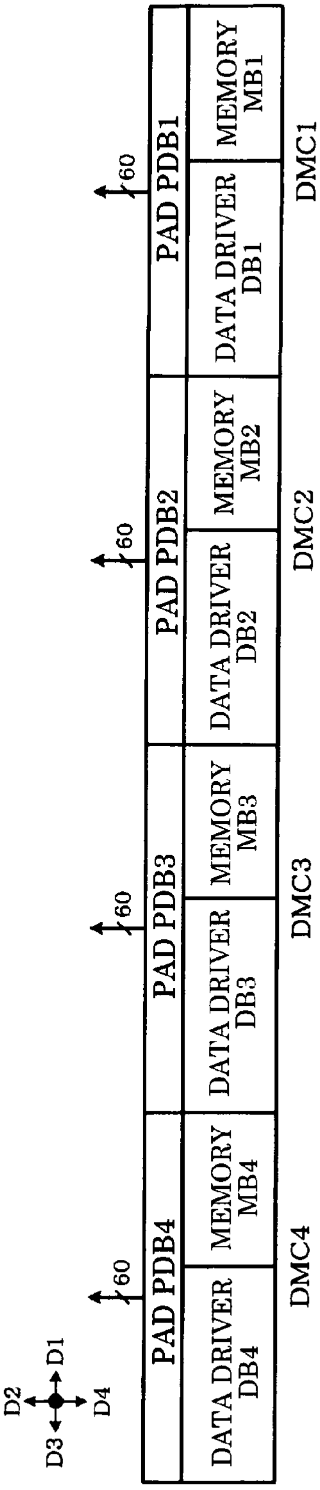

In FIG. 20B, the data driver is divided into four (=DBN) data driver blocks DB1 to DB4. The memory is also divided into four (=MBN=DBN) memory blocks MB1 to MB4. Specifically, four driver macrocells DMC1, DMC2, DMC3, and DMC4, each of which includes the data driver block, the memory block, and the pad block integrated into a macrocell, are disposed along the direction D1, for example. Therefore, each of the data driver blocks DB1 to DB4 outputs data signals for 60 (=HPN/DBN=240/4) data lines to the display panel in units of horizontal scan periods. Each of the memory blocks MB1 to MB4 stores "(VPN×HPN×PDB)/MBN=(320×240×18)/4" bits of image data.

5.2 Plurality of Read Operations in One Horizontal Scan Period

In FIG. 20B, each of the data driver blocks DB1 to DB4 outputs data signals for 60 data lines ("60×3=180" data lines when three data lines are provided for R, G, and B) in one horizontal scan period. Therefore, image data corresponding to data signals for 240 data lines must be read from the data driver blocks DB1 to DB4 corresponding to the data driver blocks DB1 to DB4 in units of horizontal scan periods.

However, when the number of bits of image data read in units of horizontal scan periods is increased, it is necessary to increase the number of memory cells (sense amplifiers) arranged in the direction D2. As a result, the width W of the integrated circuit device is increased in the direction D2 to hinder a reduction in the width of the chip. Moreover, the length of the wordline WL is increased, whereby a signal delay occurs in the wordline WL.

In this embodiment, image data stored in the memory blocks MB1 to MB4 is read from the memory blocks MB1 to MB4 into the data driver blocks DB1 to DB4 a plurality of times (RN times) in one horizontal scan period.

Figure 21:
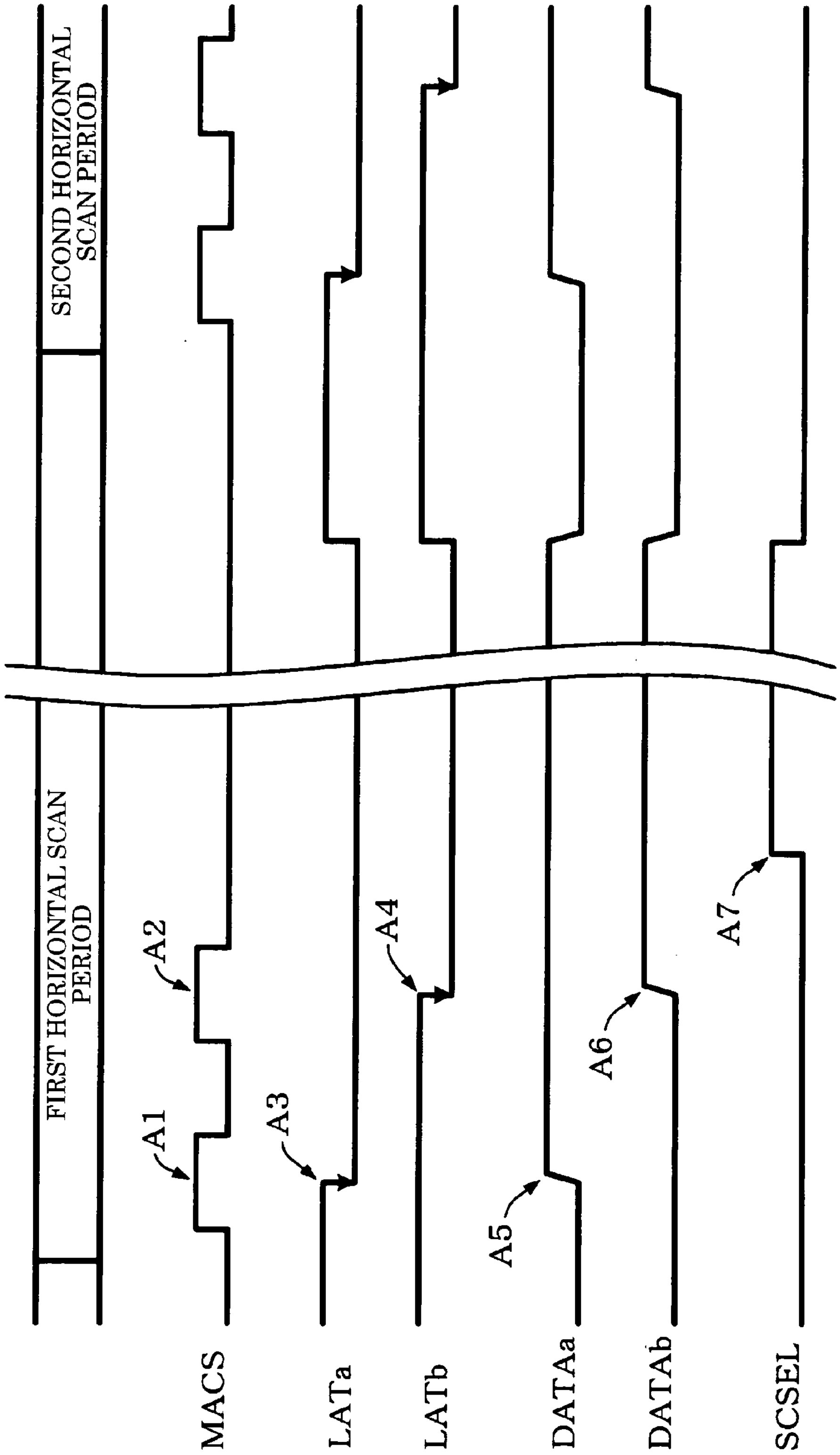
FIG. 21 is a view illustrative of a method of reading image data a plurality of times in one horizontal scan period.
Figure 22:
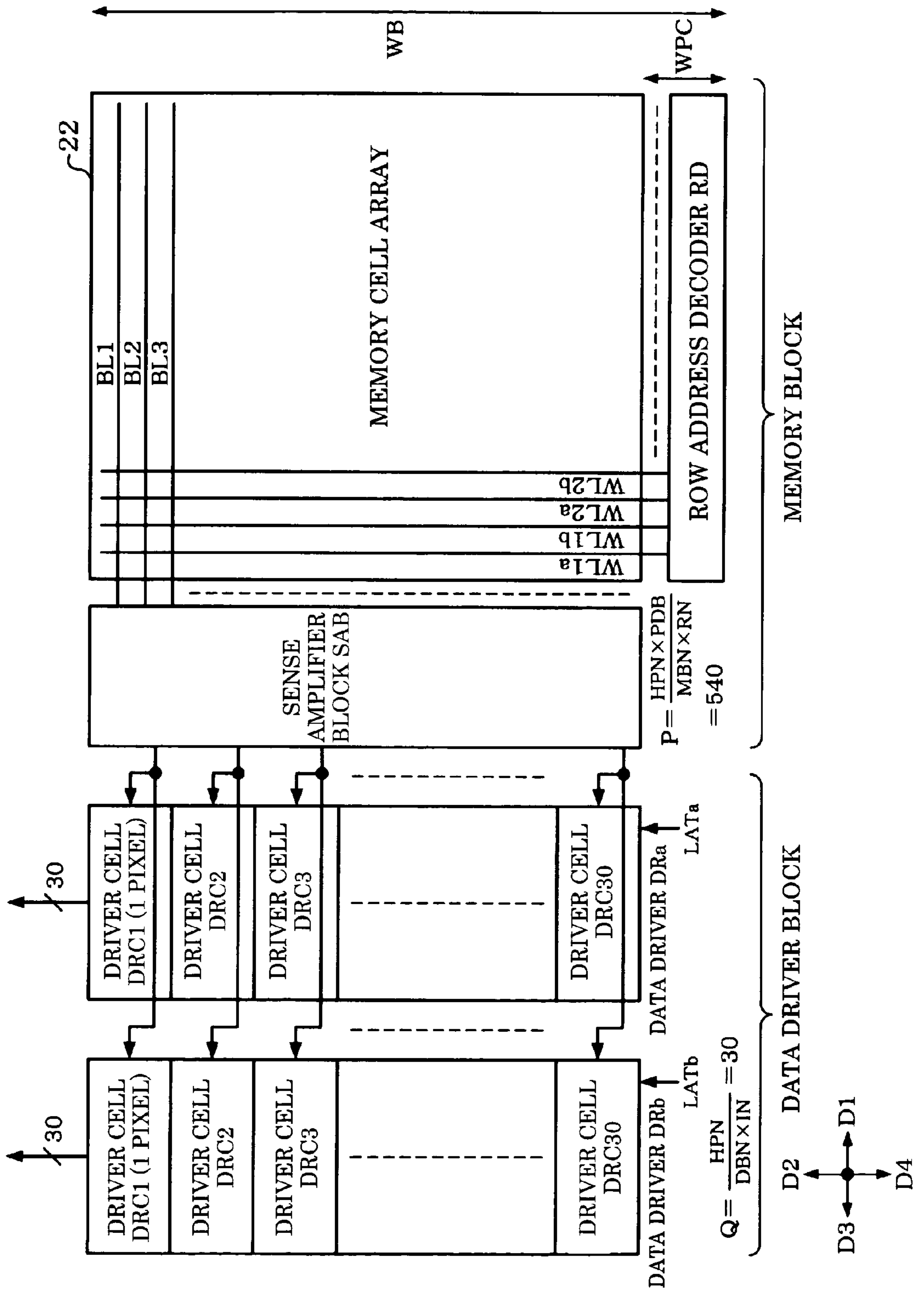
FIG. 22 is an arrangement example of data drivers and driver cells.

In FIG. 21, a memory access signal MACS (word select signal) goes active (high level) twice (RN=2) in one horizontal scan period, as indicated by A1 and A2, for example. This allows image data to be read from each memory block into each data driver block twice (RN=2) in one horizontal scan period. Then, data latch circuits included in data drivers DRa and DRb shown in FIG. 22 provided in the data driver block latch the image data read from the memory block based on latch signals LATa and LATb indicated by A3 and A4. D/A conversion circuits included in the data drivers DRa and DRb perform D/A conversion of the latched image data, and output circuits included in the data drivers DRa and DRb output data signals DATAa and DATAb obtained by D/A conversion to the data signal output lines, as indicated by A5 and A6. A scan signal SCSEL input to the gate of the TFT of each pixel of the display panel then goes active, as indicated by A7, and the data signal is input to and held in each pixel of the display panel.

In FIG. 21, the image data is read twice in the first horizontal scan period, and the data signals DATAa and DATAb are output to the data signal output lines in the first horizontal scan period. Note that the image data may be read twice and latched in the first horizontal scan period, and the data signals DATAa and DATAb corresponding to the latched image data may be output to the data signal output lines in the subsequent second horizontal scan period. FIG. 21 illustrates the case where the number RN of read operations is two. Note that the number RN may be three or more (RN≥3).

According to the method shown in FIG. 21, the image data corresponding to the data signals for 30 data lines is read from each memory block, and each of the data drivers DRa and DRb outputs the data signals for 30 data lines, as shown in FIG. 22. Therefore, the data signals for 60 data lines are output from each data driver block. In FIG. 21, it suffices to read the image data corresponding to the data signals for 30 data lines from each memory block in one read operation, as described above. Therefore, the number of memory cells and sense amplifiers in the direction D2 can be reduced in FIG. 22 in comparison with a method in which the image data is read only once in one horizontal scan period. As a result, the width of the integrated circuit device in the direction D2 can be reduced, whereby a very narrow chip can be realized. In a QVGA display, the length of one horizontal scan period is about 52 microseconds. On the other hand, the memory read time is about 40 nanoseconds, which is sufficiently shorter than 52 microseconds. Therefore, even if the number of read operations in one horizontal scan period is increased from one to two or more, the display characteristics are not affected to a large extent.

In addition to the QVGA (320×240) display panel shown in FIG. 20A, it is also possible to deal with a VGA (640×480) display panel by increasing the number of read operations in one horizontal scan period to four (RN=4), for example, whereby the degrees of freedom of the design can be increased.

A plurality of read operations in one horizontal scan period may be implemented using a first method in which the row address decoder (wordline select circuit) selects different wordlines in each memory block in one horizontal scan period, or a second method in which the row address decoder (wordline select circuit) selects a single wordline in each memory block a plurality of times in one horizontal scan period. Or, a plurality of read operations in one horizontal scan period may be implemented by combining the first method and the second method.

5.3 Arrangement of Data Driver and Driver Cell

FIG. 22 shows an arrangement example of data drivers and driver cells included in the data drivers. As shown in FIG. 22, the data driver block includes data drivers DRa and DRb (first to mth data drivers) arranged along the direction D1. Each of the data drivers DRa and DRb includes 30 (Q in a broad sense) driver cells DRC1 to DRC30.

When the wordline WL1*a* of the memory block has been selected and the first image data has been read from the memory block, as indicated by A1 in FIG. 21, the data driver DRa latches the read image data based on the latch signal LATa indicated by A3. The data driver DRa performs D/A conversion of the latched image data, and outputs the data signal DATAa corresponding to the first image data to the data signal output line, as indicated by A5.

When the wordline WL1*b* of the memory block has been selected and the second image data has been read from the memory block, as indicated by A2 in FIG. 21, the data driver DRb latches the read image data based on the latch signal LATb indicated by A4. The data driver DRb performs D/A conversion of the latched image data, and outputs the data signal DATAb corresponding to the second image data to the data signal output line, as indicated by A6.

Each of the data drivers DRa and DRb outputs data signals for 30 data lines corresponding to 30 pixels, whereby the data signals for 60 data lines corresponding to 60 pixels are output in total.

A problem in which the width W of the integrated circuit device in the direction D2 is increased due to an increase in the size of the data driver can be prevented by disposing (stacking) the data drivers DRa and DRb along the direction D1, as shown in FIG. 22. The data driver is configured in various ways depending on the type of display panel. In this case, data drivers having various configurations can be efficiently arranged by disposing the data drivers along the direction D1. FIG. 22 illustrates the case where the number of data drivers disposed along the direction D1 is two. Note that the number of data drivers disposed along the direction D1 may be three or more.

In FIG. 22, each of the data drivers DRa and DRb includes 30 (Q) driver cells DRC1 to DRC30 arranged along the direction D2. Each of the driver cells DRC1 to DRC30 receives image data of one pixel. Each of the driver cells DRC1 to DRCQ performs D/A conversion of the image data of one pixel, and outputs a data signal corresponding to the image data of one pixel. Each of the driver cells DRC1 to DRC30 may include a data latch circuit, the DAC (DAC for one pixel) shown in FIG. 10A, and the output section SQ shown in FIGS. 10B and 10C.

In FIG. 22, suppose that the number of pixels of the display panel in the horizontal scan direction (the number of pixels in the horizontal scan direction driven by each integrated circuit device when two or more integrated circuit devices cooperate to drive the data lines of the display panel) is HPN, the number of data driver blocks (number of block divisions) is DBN, and the number of inputs of image data to the driver cell in one horizontal scan period is IN. The number IN is equal to the number RN of image data read operations in one horizontal scan period described with reference to FIG. 21. In this case, the number Q of driver cells DRC1 to DRC30 arranged along the direction D2 may be expressed as "Q=HPN/(DBN×IN)". In FIG. 22, since "HPN=240", "DBN=4", and "IN=2", "Q=240/(4×2)=30".

When the width (pitch) of the driver cells DRC1 to DR30 in the direction D2 is WD, and the width of the peripheral circuit section (e.g. buffer circuit and/or interconnect region) included in the data driver block in the direction D2 is WPCB, the width WB (maximum width) of the first to Nth circuit blocks CB1 to CBN in the direction D2 may be expressed as "Q×WD≤WB<(Q+1)×WD+WPCB". When the width of the peripheral circuit section (e.g. row address decoder RD and/or interconnect region) included in the memory block in the direction D2 is WPC, the width WB may be expressed as "Q×WD≤WB<(Q+1)×WD+WPC".

Suppose that the number of pixels of the display panel in the horizontal scan direction is HPN, the number of bits of image data of one pixel is PDB, the number of memory blocks is MBN (=DBN), and the number of read operations of image data from the memory block in one horizontal scan period is RN. In this case, the number P of sense amplifiers (sense amplifiers which output one bit of image data) arranged in the sense amplifier block SAB along the direction D2 may be expressed as "P=(HPN×PDB)/(MBN×RN)". In FIG. 22, since "HPN=240", "PDB=18", "MBN=4", and "RN=2", "P=(240×18)/(4×2)=540". The number P is the number of effective sense amplifiers corresponding to the number of effective memory cells, and does not include the number of ineffective sense amplifiers such as a dummy memory cell sense amplifier.

When the width (pitch) of each sense amplifier included in the sense amplifier block SAB in the direction D2 is WS, the width WSAB of the sense amplifier block SAB (memory block) in the direction D2 may be expressed as "WSAB=P×WS". When the width of the peripheral circuit section included in the memory block in the direction D2 is WPC, the width WB (maximum width) of the circuit blocks CB1 to CBN in the direction D2 may also be expressed as "P×WS≤WB<(P+PDB)×WS+WPC".

5.4 Layout of Data Driver Block

Figure 23:
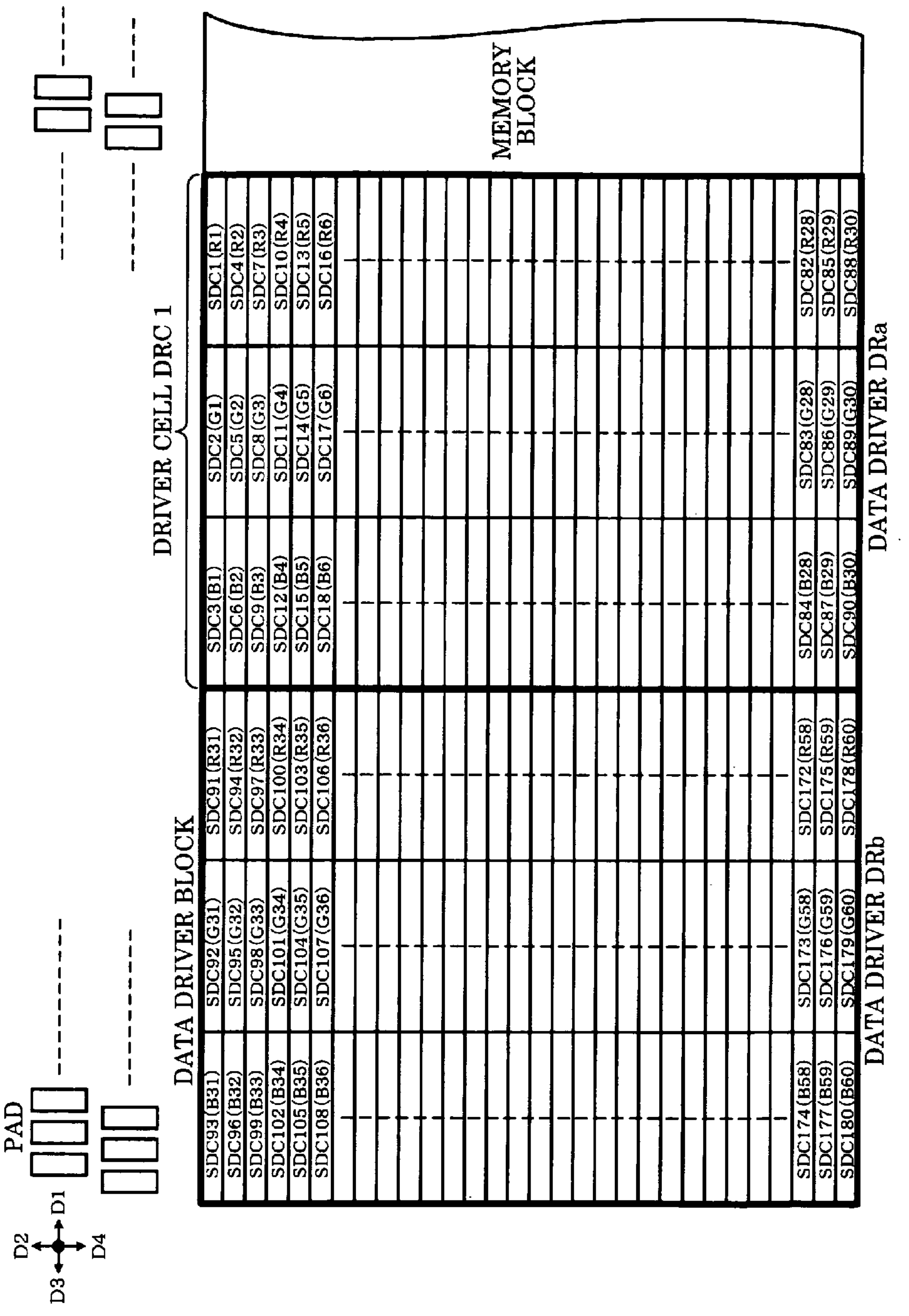
FIG. 23 is an arrangement example of subpixel driver cells.

FIG. 23 shows a more detailed layout example of the data driver block. In FIG. 23, the data driver block includes a plurality of subpixel driver cells SDC1 to SDC180, each of which outputs a data signal corresponding to image data of one subpixel. In the data driver block, the subpixel driver cells are arranged along the direction D1 (direction along the long side of the subpixel driver cell) and the direction D2 perpendicular to the direction D1. Specifically, the subpixel driver cells SDC1 to SDC180 are disposed in a matrix. The pads (pad block) for electrically connecting the output lines of the data driver block with the data lines of the display panel are disposed on the D2 side of the data driver block.

For example, the driver cell DRC1 of the data driver DRa shown in FIG. 22 includes the subpixel driver cells SDC1, SDC2, and SDC3 shown in FIG. 23. The subpixel driver cells SDC1, SDC2, and SDC3 are R (red), G (green), and B (blue) subpixel driver cells, respectively. The R, CT and B image data (R1, G1, B1) corresponding to the first data signals is input to the subpixel driver cells SDC1, SDC2, and SDC3 from the memory block. The subpixel driver cells SDC1, SDC2, and SDC3 perform D/A conversion of the image data (R1, G1, B1), and output the first R, G, and B data signals (data voltages) to the R, G, and B pads corresponding to the first data lines.

Likewise, the driver cell DRC2 includes the R, G, and B subpixel driver cells SDC4, SDC5, and SDC6. The R, G, and B image data (R2, G2, B2) corresponding to the second data signals is input to the subpixel driver cells SDC4, SDC5, and SDC6 from the memory block. The subpixel driver cells SDC4, SDC5, and SDC6 perform D/A conversion of the image data (R2, G2, B2), and output the second R, G, and B data signals (data voltages) to the R, G, and B pads corresponding to the second data lines. The above description also applies to the remaining subpixel driver cells.

The number of subpixels is not limited to three, but may be four or more. The arrangement of the subpixel driver cells is not limited to the arrangement shown in FIG. 23. For example, the R, G, and B subpixel driver cells may be stacked along the direction D2.

5.5 Layout of Memory Block

Figure 24:
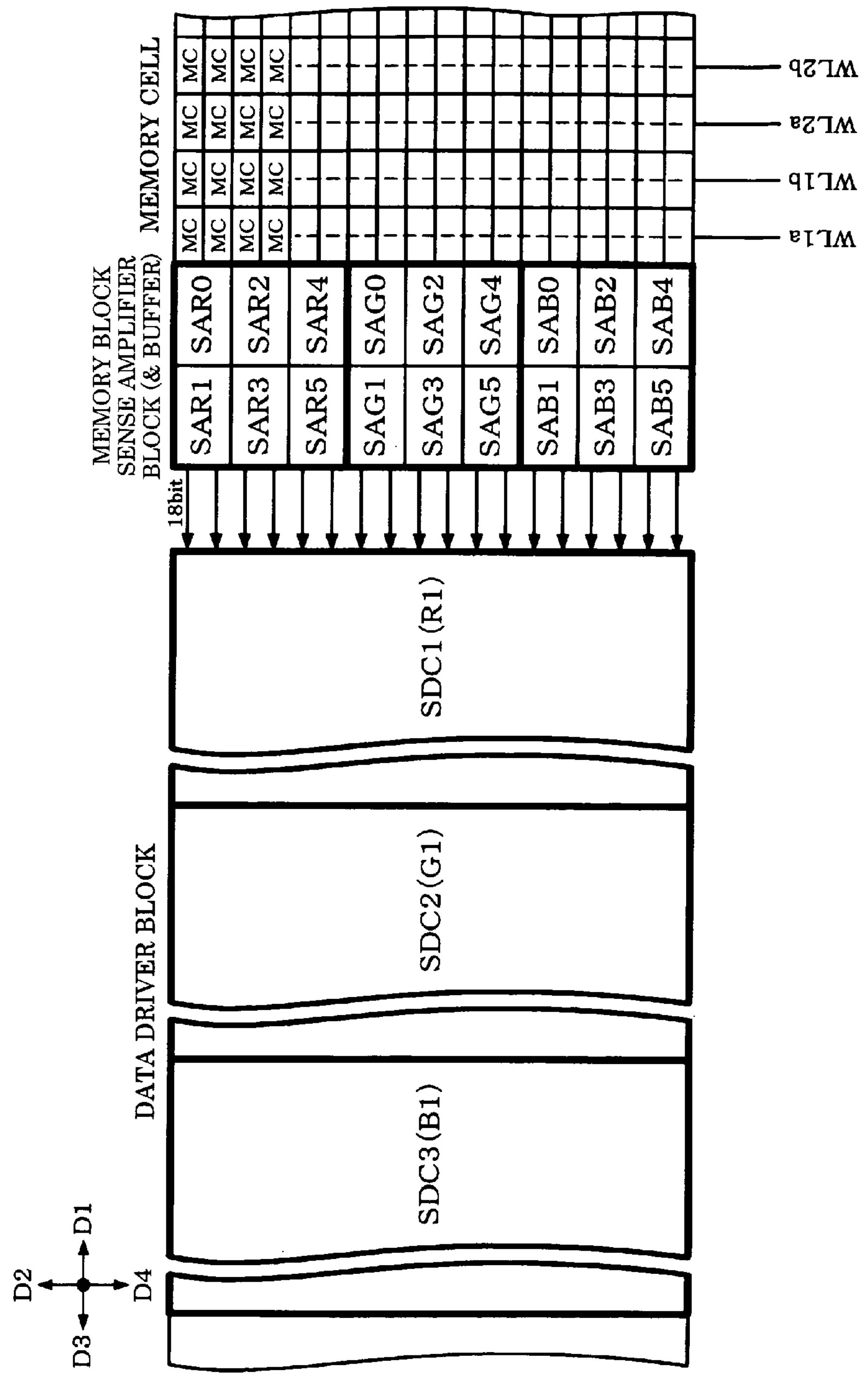
FIG. 24 is an arrangement example of sense amplifiers and memory cells.

FIG. 24 shows a layout example of the memory block. FIG. 24 is a detailed view of the portion of the memory block corresponding to one pixel (six bits each for R, G, and B; 18 bits in total).

The portion of the sense amplifier block corresponding to one pixel includes R sense amplifiers SAR0 to SAR5, G sense amplifiers SAG0 to SAG5, and B sense amplifiers SAB0 to SAB5. In FIG. 24, two (a plurality of in a broad sense) sense amplifiers (and buffer) are stacked in the direction D1. Two rows of memory cells are arranged along the direction D1 on the D1 side of the stacked sense amplifiers SAR0 and SAR1, the bitline of the memory cells in the upper row being connected with the sense amplifier SAR0, and the bitline of the memory cells in the lower row being connected with the sense amplifier SAR1, for example. The sense amplifiers SAR0 and SAR1 amplify the image data signals read from the memory cells, and two bits of image data are output from the sense amplifiers SAR0 and SAR1. The above description also applies to the relationship between other sense amplifiers and memory cells.

In the configuration shown in FIG. 24, a plurality of image data read operations in one horizontal scan period shown in FIG. 21 may be realized as follows. Specifically, in the first horizontal scan period (first scan line select period), the first image data read operation is performed by selecting the wordline WL1*a*, and the first data signal DATAa is output as indicated by A5 in FIG. 21. In this case, R, G, and B image data from the sense amplifiers SAR0 to SAR5, SAG0 to SAG5, and SAB0 to SAB5 is respectively input to the subpixel driver cells SDC1, SDC2, and SDC3. Then, the second image data read operation is performed in the first horizontal scan period by selecting the wordline WL1*b*, and the second data signal DATAb is output as indicated by A6 in FIG. 21. In this case, R, G, and B image data from the sense amplifiers SAR0 to SAR5, SAG0 to SAG5, and SAB0 to SAB5 is respectively input to the subpixel driver cells SDC91, SDC92, and SDC93 shown in FIG. 23. In the subsequent second horizontal scan period (second scan line select period), the first image data read operation is performed by selecting the wordline WL2*a*, and the first data signal DATAa is output. Then, the second image data read operation is performed in the second horizontal scan period by selecting the wordline WL2*b*, and the second data signal DATAb is output.

A modification may be made in which the sense amplifiers are not stacked in the direction D1. The rows of memory cells connected with each sense amplifier may be switched using column select signals. In this case, a plurality of image data read operations in one horizontal scan period may be realized by selecting a single wordline in the memory block a plurality of times in one horizontal scan period.

5.6 Layout of Subpixel Driver Cell

Figure 25:
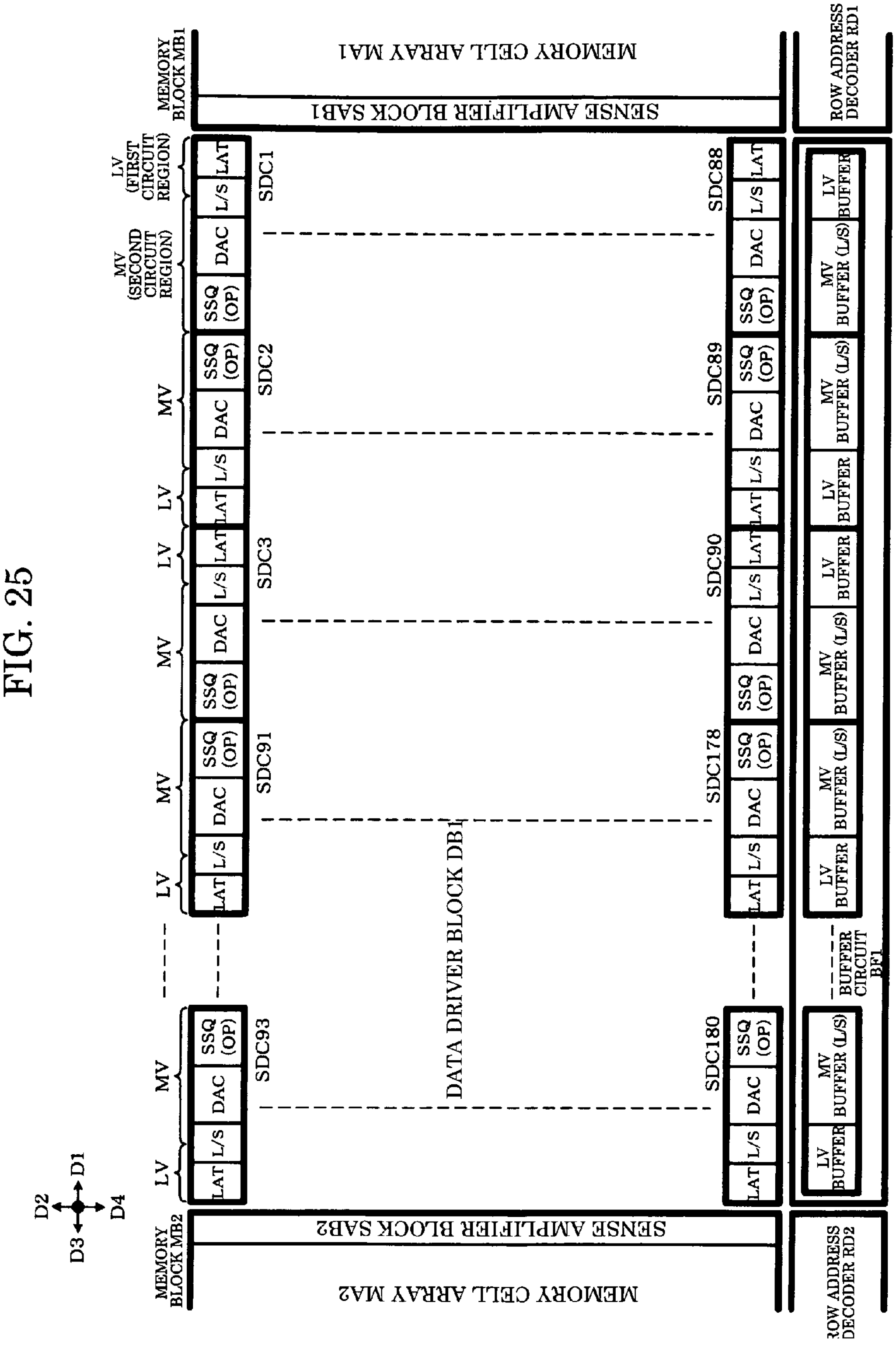
FIG. 25 is a configuration example of the subpixel driver cell.

FIG. 25 shows a detailed layout example of the subpixel driver cells. As shown in FIG. 25, each of the subpixel driver cells SDC1 to SDC180 includes a latch circuit LAT, a level shifter L/S, a D/A converter DAC, and an output section SSQ. Another logic circuit such as a grayscale-control frame rate control (FRC) circuit may be provided between the latch circuit LAT and the level shifter L/S.

The latch circuit LAT included in each subpixel driver cell latches six-bit image data of one subpixel from the memory block MB1. The level shifter L/S converts the voltage level of the six-bit image data signal from the latch circuit LAT. The D/A converter DAC performs D/A conversion of the six-bit image data using the grayscale voltage. The output section SSQ includes a (voltage-follower-connected) operational amplifier OP which performs impedance conversion of the output signal from the D/A converter DAC, and drives one data line corresponding to one subpixel. The output section SSQ may include a discharge transistor (switch element), an eight-color-display transistor, and a DAC driver transistor in addition to the operational amplifier OP.

As shown in FIG. 25, each subpixel driver cell includes an LV region (first circuit region in a broad sense) in which a circuit which operates using a power supply at a low voltage (LV) level (first voltage level in a broad sense) is disposed, and an MV region (second circuit region in a broad sense) in which a circuit which operates using a power supply at a middle voltage (MV) level (second voltage level in a broad sense) higher than the LV level is disposed. The low voltage (LV) is the operating voltage of the logic circuit block LB, the memory block MB, and the like. The middle voltage (MV) is the operating voltage of the D/A converter, the operational amplifier, the power supply circuit, and the like. The output transistor of the scan driver is provided with a power supply at a high voltage (HV) level (third voltage level in a broad sense) to drive the scan line.

For example, the latch circuit LAT (or another logic circuit) is disposed in the LV region (first circuit region) of the subpixel driver cell. The D/A converter DAC and the output section SSQ including the operational amplifier OP are disposed in the MV region (second circuit region). The level shifter L/S converts the LV level signal into an MV level signal.

In FIG. 25, a buffer circuit BF1 is provided on the D4 side of the subpixel driver cells SDC1 to SDC180. The buffer circuit BF1 buffers a driver control signal from the logic circuit block LB, and outputs the driver control signal to the subpixel driver cells SDC1 to SDC180. In other words, the buffer circuit BF1 functions as a driver control signal repeater block.

In more detail, the buffer circuit BF1 includes an LV buffer disposed in the LV region and an MV buffer disposed in the MV region. The LV buffer receives and buffers the LV level driver control signal (e.g. latch signal) from the logic circuit block LB, and outputs the driver control signal to the circuit (LAT) disposed in the LV region of the subpixel driver cell on the D2 side of the LV buffer. The MV buffer receives the LV level driver control signal (e.g. DAC control signal or output control signal) from the logic circuit block LB, converts the LV level driver control signal into an MV level driver control signal using a level shifter, buffers the converted signal, and outputs the buffered signal to the circuit (DAC and SSQ) disposed in the MV region of the subpixel driver cell on the D2 side of the MV buffer In this embodiment, the subpixel driver cells SDC1 to SDC180 are disposed so that the MV regions (or LV regions) of the subpixel driver cells are adjacent to each other along the direction D1, as shown in FIG. 25. Specifically, the adjacent subpixel driver cells are mirror-image disposed on either side of the boundary extending along the direction D2. For example, the subpixel driver cells SDC1 and SDC2 are disposed so that the MV regions are adjacent to each other. The subpixel driver cells SDC3 and SDC91 are disposed so that the MV regions are adjacent to each other. The subpixel driver cells SDC2 and SDC3 are disposed so that the LV regions are adjacent to each other.

It is unnecessary to provide a guard ring or the like between the subpixel driver cells by disposing the subpixel driver cells so that the MV regions are adjacent to each other, as shown in FIG. 25. Therefore, the width of the data driver block in the direction D1 can be reduced in comparison with a method of disposing the subpixel driver cells (driver cells) so that the MV region is adjacent to the LV region, whereby the area of the integrated circuit device can be reduced.

According to the arrangement method shown in FIG. 25, the MV regions of the adjacent subpixel driver cells can be effectively utilized as the routing region of pull-out lines of output signals from the subpixel driver cells, as described later, whereby the layout efficiency can be improved.

According to the arrangement method shown in FIG. 25, the memory block can be disposed adjacent to the LV region (first circuit region) of the subpixel driver cell. In FIG. 25, the memory block MB1 is disposed adjacent to the LV regions of the subpixel driver cells SDC1 and SDC88, for example. The memory block MB2 is disposed adjacent to the LV regions of the subpixel driver cells SDC93 and SDC180. The memory blocks MB1 and MB2 operate using a power supply at the LV level. Therefore, the width of the driver macrocell in the direction D1 including the data driver block and the memory block can be reduced by disposing the data driver block and the memory block so that the LV region of the subpixel driver cell is adjacent to the memory block, whereby the area of the integrated circuit device can be reduced.

According to the method shown in FIG. 25, even if the integrated circuit device does not include the memory block, the repeater block can be disposed in the region between the LV regions of the adjacent subpixel driver cells. This allows the LV level signal (image data signal) from the logic circuit block LB to be buffered by the repeater block and input to the subpixel driver cells.

6. Electronic Instrument

Figure 26A:
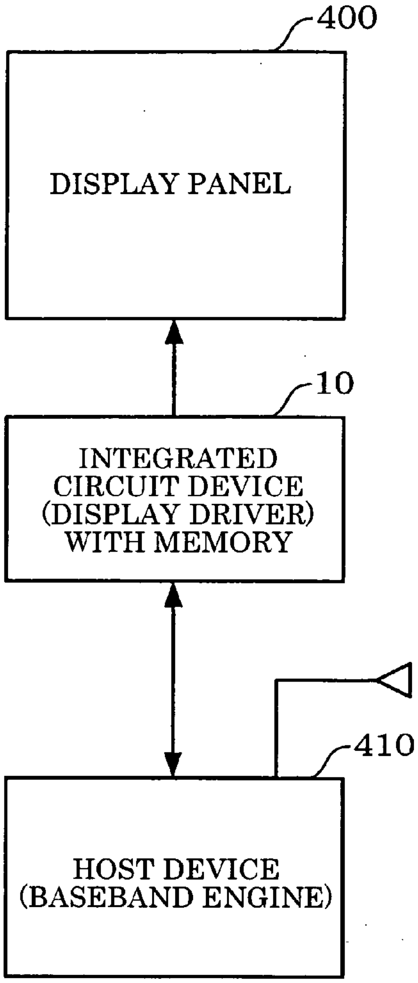
FIGS. 26A and 26B illustrate a configuration example of an electronic instrument.
Figure 26B:
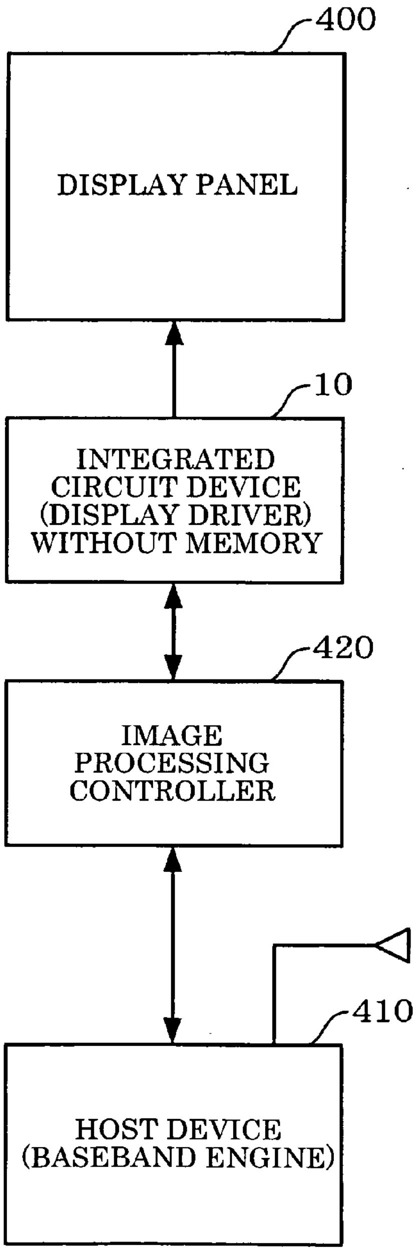

FIGS. 26A and 26B show examples of an electronic instrument (electro-optical device) including the integrated circuit device 10 according to the above embodiment. The electronic instrument may include constituent elements (e.g. camera, operation section, or power supply) other than the constituent elements shown in FIGS. 26A and 23B. The electronic instrument according to this embodiment is not limited to a portable telephone, and may be a digital camera, PDA, electronic notebook, electronic dictionary, projector, rear-projection television, portable information terminal, or the like.

In FIGS. 26A and 26B, a host device 410 is a microprocessor unit (MPU), a baseband engine (baseband processor), or the like. The host device 410 controls the integrated circuit device 10 as a display driver. The host device 410 may perform processing as an application engine and a baseband engine or processing as a graphic engine such as compression, decompression, or sizing. An image processing controller (display controller) 420 shown in FIG. 26B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switch elements such as a TFT or TFD. The display panel 400 may be a panel other than an active matrix type panel, or may be a panel other than a liquid crystal panel.

In FIG. 26A, the integrated circuit device 10 may include a memory. In this case, the integrated circuit device 10 writes image data from the host device 410 into the built-in memory, and reads the written image data from the built-in memory to drive the display panel. In FIG. 26B, the integrated circuit device 10 may not include a memory. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, any term (such as the output-side I/F region, the input-side I/F region, and two pieces) cited with a different term having broader or the same meaning (such as the first interface region, the second interface region, and K pieces) at least once in this specification or drawings can be replaced by the different term in any place in this specification and drawings.

The method according to the above embodiments in which the control transistors are disposed in the pad arrangement region may also be applied to an integrated circuit device having an arrangement and a configuration differing from those shown in FIG. 3.

What is claimed is:

1. A display driver which is configured to drive a display panel that is positioned external to the display driver, the display driver comprising:

at least one data driver block that drives data lines of the display panel;

control transistors, one of the control transistors being provided corresponding to one of output lines of the data driver block and being controlled by using a common control signal; and a pad arrangement region in which data driver pads for electrically connecting the data lines and the output lines of the data driver block are disposed, the data driver pads being configured to be electrically connected to the data lines of the display panel by using a bump technology, the control transistors being disposed in the pad arrangement region, one of the control transistors being disposed in a lower layer of one of the data driver pads so that the one of the control transistors at least partially overlaps the one of the data driver pads.

2. The display driver as defined in claim 1, the common control signal being input to a gate of each of the control transistors, and each of the output lines of the data driver block being connected with a drain of one of the control transistors.

3. The display driver as defined in claim 2, a common potential being supplied to a source of each of the control transistors, and each of the output lines of the data driver block being set at the common potential when the common control signal is active.

4. The display driver as defined in claim 1, one of the control transistors being a discharge transistor that sets one of the output lines of the data driver block at a ground potential when a discharge signal that is the common control signal has become active.

5. The display driver as defined in claim 1, comprising:

an operational amplifier that performs impedance conversion of a data signal output to one of the data lines, the operational amplifier including a differential section and a driver section, transistors of the differential section and transistors of the driver section being disposed in the data driver block.

6. The display driver as defined in claim 1, comprising:

a memory block that stores image data used by the data driver block; and a pad block in which the data driver pads and the control transistors are disposed, the data driver block, the memory block, and the pad block being integrated into a macrocell as a driver macrocell, the data driver block and the memory block being disposed along a first direction, and the pad block being disposed on the second direction side of the data driver block and the memory block, the second direction being perpendicular to the first direction.

7. The display driver as defined in claim 1, the data driver block including subpixel driver cells, one of the subpixel driver cells outputting a data signal corresponding to image data of one subpixel, and the subpixel driver cells being disposed in the data driver block along a first direction and a second direction perpendicular to the first direction.

8. The display driver as defined in claim 2, the output lines of the data driver block including a first output line and a second output line, the control transistors including a first control transistor and a second control transistor, the first control transistor being provided between the first output line and the second output line, a first control signal being input to a gate of the first control transistor, and the second control transistor being provided between the first output line and the second output line, a second control signal being input to a gate of the second control transistor.

9. The display driver as defined in claim 8, the first control transistor being a P-type transistor and the second control transistor being an N-type transistor.

10. The display driver as defined in claim 9, the first output line and the second output line being set to a common potential by the first control signal and the second control signal.

11. An electronic instrument comprising:

the display driver as defined in claim 1; and a display panel driven by the display driver.

12. A display driver which is configured to drive a display panel that is positioned external to the display driver, the display driver having a first side that is a short side of the display driver, a second side that is a long side of the display driver, a third side that is a short side of the display driver and that is opposite to the first side, a fourth side that is a long side of the display driver and that is opposite to the second side, a first direction that is a direction from the first side toward the third side, and a second direction that is a direction from the second side toward the fourth side, the display driver comprising:

first to Nth circuit blocks (N is an integer of two or more) disposed along the first direction, the first to Nth circuit blocks including at least one data driver block that drives data lines of the display panel;

a first interface region that is disposed between the fourth side and the first to Nth circuit blocks in a plain view and serves as a pad arrangement region, control transistors and data driver pads being disposed in the first interface region, one of the control transistors being provided corresponding to one of the output lines of the data driver block and being controlled using a common control signal, the one of the control transistors being disposed in a lower layer of one of the data driver pads so that the one of the control transistors at least partially overlaps the one of the data driver pads, the one of the data driver pads being configured to electrically connect one of the data lines and one of output lines of the data driver block, the one of the data driver pads being configured to be electrically connected to the data lines of the display panel by using a bump technology; and a second interface region that is disposed between the second side and the first to Nth circuit blocks in the plain view and serves as a pad arrangement region.

13. An electronic instrument comprising:

the display driver as defined in claim 12; and a display panel driven by the display driver.

14. The display driver as defined in claim 12, the common control signal being input to a gate of each of the control transistors, and each of the output lines of the data driver block being connected with a drain of one of the control transistors.

15. The display driver as defined in claim 14, a common potential being supplied to a source of each of the control transistors, and each of the output lines of the data driver block being set at the common potential when the common control signal is active.

16. The display driver as defined in claim 12, one of the control transistors being a discharge transistor that sets one of the output lines of the data driver block at a ground potential when a discharge signal that is the common control signal has become active.

17. The display driver as defined in claim 12, comprising:

an operational amplifier that performs impedance conversion of a data signal output to one of the data lines, the operational amplifier including a differential section and a driver section, transistors of the differential section and transistors of the driver section being disposed in the data driver block.

18. The display driver as defined in claim 12, comprising:

electrostatic protection elements one of which is connected with one of the output lines of the data driver block and disposed in the pad arrangement region, the control transistors being disposed between the fourth side and the data driver block in the plain view, and the electrostatic protection elements being disposed between the fourth side and the control transistors in the plain view.

19. The display driver as defined in claim 18, the pad arrangement region including arrangement areas arranged along the first direction, and K (K is an integer of two or more) of the data driver pads arranged along the second direction and K of the electrostatic protection elements one of which is connected with one of the K data driver pads being disposed in one of the arrangement areas.

20. The display driver as defined in claim 19, the K data driver pads arranged along the second direction being disposed so that center positions of the data driver pads are displaced from each other in the first direction.

21. The display driver as defined in claim 19, a first electrostatic protection element of the K electrostatic protection elements including:

a first diode provided between a high-potential-side power supply and a first output line of the data driver block; and a second diode provided between a low-potential-side power supply and the first output line of the data driver block, a second electrostatic protection element of the K electrostatic protection elements including:

a third diode provided between the high-potential-side power supply and a second output line of the data driver block; and a fourth diode provided between the low-potential-side power supply and the second output line of the data driver block, and the first, second, third, and fourth diodes being disposed along the second direction in each of the arrangement areas.

22. The display driver as defined in claim 21, the first and third diodes being formed in a first well region, the second and fourth diodes being formed in a second well region, and the first and second well regions being isolated in the second direction.

23. The display driver as defined in claim 18, one of the electrostatic protection elements including a diffusion region of which a long side extends along the first direction and a short side extends along the second direction.

24. The display driver as defined in claim 18, comprising:

a power supply protection circuit provided between a high-potential-side power supply and a low-potential-side power supply.

25. The display driver as defined in claim 12, the data driver block including subpixel driver cells, one of the subpixel driver cells outputting a data signal corresponding to image data of one subpixel, and the subpixel driver cells being disposed in the data driver block along a first direction and a second direction perpendicular to the first direction.

* * * * *